US011862208B1

(12) United States Patent
Kief

(10) Patent No.: US 11,862,208 B1
(45) Date of Patent: Jan. 2, 2024

(54) NON-LOCAL SPIN VALVE SENSOR FOR HIGH LINEAR DENSITY

(71) Applicant: Seagate Technology LLC, Fremont, CA (US)

(72) Inventor: Mark Thomas Kief, Lakeville, MN (US)

(73) Assignee: Seagate Technology LLC, Fremont, CA (US)

( * ) Notice: Subject to any disclaimer, the term of this patent is extended or adjusted under 35 U.S.C. 154(b) by 13 days.

(21) Appl. No.: 17/686,562

(22) Filed: Mar. 4, 2022

Related U.S. Application Data

(63) Continuation of application No. 17/145,909, filed on Jan. 11, 2021, now Pat. No. 11,282,538.

(51) Int. Cl.
*G11B 5/39* (2006.01)
*G01R 33/09* (2006.01)
*G11B 5/33* (2006.01)
*G11B 5/31* (2006.01)

(52) U.S. Cl.
CPC .......... *G11B 5/3909* (2013.01); *G01R 33/093* (2013.01); *G11B 5/3166* (2013.01); *G11B 5/332* (2013.01); *G11B 5/3912* (2013.01); *G11B 5/3948* (2013.01); *Y10T 29/49036* (2015.01)

(58) Field of Classification Search
None
See application file for complete search history.

(56) References Cited

U.S. PATENT DOCUMENTS

| 6,381,171 | B1 | 4/2002 | Inomata et al. |
| 7,020,013 | B2 | 3/2006 | Johnson |
| 7,193,891 | B2 | 3/2007 | Johnson |
| 7,209,328 | B2 | 4/2007 | Ito et al. |
| 7,253,995 | B2 | 8/2007 | Takahashi et al. |
| 7,280,322 | B2 | 10/2007 | Takahashi et al. |
| 7,298,597 | B2 | 11/2007 | Carey et al. |
| 7,349,186 | B2 | 3/2008 | Ito |
| 7,522,392 | B2 | 4/2009 | Carey et al. |
| 7,755,929 | B2 | 7/2010 | Inomata et al. |
| 8,072,713 | B2 | 12/2011 | Yamada et al. |

(Continued)

OTHER PUBLICATIONS

U.S. Patent Office issued prosecution for U.S. Appl. No. 17/145,909, filed Jan. 11, 2021, including: Notice of Allowance and Fees Due (PTOL-85) dated Nov. 26, 2021, 13 pages; Applicant Initiated Interview Summary dated Aug. 10, 2021, 2 pages; Ex parte Quayle Action issued Jul. 22, 2021, 5 pages; 20 pages total.

(Continued)

*Primary Examiner* — Craig A. Renner
(74) *Attorney, Agent, or Firm* — Westman, Champlin & Koehler, P.A.

(57) ABSTRACT

A non-local spin valve (NLSV) sensor includes a bearing surface and a detector located proximate to the bearing surface. The NLSV sensor also includes a channel layer located behind the detector relative to the bearing surface, and in a substantially same plane as the detector. The channel layer has a front end that is proximate to the detector and a rear end that is distal to the detector. The NLSV sensor further includes first and second spin injectors, with the first spin injector located proximate to the rear end of the channel layer and positioned above the channel layer, and the second spin injector located proximate the rear end of the channel layer and positioned below the channel layer.

9 Claims, 13 Drawing Sheets

(56) References Cited

U.S. PATENT DOCUMENTS

| | | |
|---|---|---|
| 8,085,513 B2 | 12/2011 | Sasaki |
| 8,238,064 B2 | 8/2012 | Yamada et al. |
| 8,295,006 B2 | 10/2012 | Sugano et al. |
| 8,339,750 B2 | 12/2012 | Sasaki |
| 8,488,282 B2 | 7/2013 | Sasaki et al. |
| 8,619,393 B2 | 12/2013 | Stokes |
| 8,644,058 B2 | 2/2014 | Yamada et al. |
| 8,665,568 B2 | 3/2014 | Sasaki |
| 8,717,715 B1 | 5/2014 | Sato et al. |
| 8,760,817 B2 | 6/2014 | Boone, Jr. et al. |
| 8,861,136 B2 | 10/2014 | Sasaki et al. |
| 8,872,514 B2 | 10/2014 | Sasaki et al. |
| 8,929,034 B2 | 1/2015 | Stokes |
| 9,019,664 B2 | 4/2015 | Song et al. |
| 9,042,061 B2 | 5/2015 | Dimitrov et al. |
| 9,064,509 B2 | 6/2015 | Dimitrov et al. |
| 9,087,535 B2 | 7/2015 | Singleton et al. |
| 9,099,119 B2 | 8/2015 | Mihajlovic et al. |
| 9,112,140 B2 | 8/2015 | Hase et al. |
| 9,117,465 B2 | 8/2015 | Kamiguchi et al. |
| 9,123,361 B1 | 9/2015 | Kief et al. |
| 9,196,273 B2 | 11/2015 | Shirotori et al. |
| 9,240,202 B1 | 1/2016 | Kamiguchi et al. |
| 9,348,004 B2 | 5/2016 | Sasaki et al. |
| 9,384,762 B2 | 7/2016 | Singleton et al. |
| 9,429,633 B2 | 8/2016 | Mihajlovic et al. |
| 9,437,223 B2 | 9/2016 | Shirotori et al. |
| 9,478,240 B1 | 10/2016 | Deen et al. |
| 9,633,678 B2 | 4/2017 | Deen et al. |
| 9,653,103 B2 | 5/2017 | Kamiguchi et al. |
| 9,685,178 B1 | 6/2017 | Deen et al. |
| 9,704,515 B2 | 7/2017 | Deen et al. |
| 9,711,171 B2 | 7/2017 | Deen et al. |
| 9,720,056 B2 | 8/2017 | Sasaki |
| 9,812,157 B1 | 11/2017 | Jung et al. |
| 9,934,798 B1 | 4/2018 | Deen et al. |
| 9,947,347 B1 | 4/2018 | Van Der Heijden et al. |
| 10,026,424 B2 | 7/2018 | Deen et al. |
| 10,141,501 B2 | 11/2018 | Koike |
| 10,347,823 B2 | 7/2019 | Koike |
| 10,446,176 B1 | 10/2019 | Deen et al. |
| 2004/0257714 A1 | 12/2004 | Takahashi et al. |
| 2005/0002128 A1 | 1/2005 | Ito et al. |
| 2005/0088787 A1 | 4/2005 | Takahashi et al. |
| 2006/0022220 A1 | 2/2006 | Inomata et al. |
| 2006/0221509 A1 | 10/2006 | Carey et al. |
| 2006/0262458 A1 | 11/2006 | Carey et al. |
| 2007/0253116 A1 | 11/2007 | Takahashi |
| 2007/0253121 A1 | 11/2007 | Yamada et al. |
| 2008/0176107 A1 | 7/2008 | Takahashi et al. |
| 2009/0034131 A1 | 2/2009 | Yamada et al. |
| 2009/0154030 A1 | 6/2009 | Yamada et al. |
| 2009/0161265 A1 | 6/2009 | Sugano et al. |
| 2009/0310263 A1 | 12/2009 | Sasaki |
| 2010/0119875 A1 | 5/2010 | Sasaki |
| 2010/0296202 A1 | 11/2010 | Boone, Jr. et al. |
| 2011/0042648 A1 | 2/2011 | Koo et al. |
| 2011/0204886 A1 | 8/2011 | Sasaki et al. |
| 2011/0205666 A1 | 8/2011 | Sasaki et al. |
| 2012/0133008 A1 | 5/2012 | Yamada et al. |
| 2012/0211848 A1 | 8/2012 | Sasaki et al. |
| 2012/0307404 A1 | 12/2012 | Braganca et al. |
| 2013/0258524 A1 | 10/2013 | Sasaki et al. |
| 2014/0168812 A1 | 6/2014 | Braganca et al. |
| 2014/0204487 A1 | 7/2014 | Hase et al. |
| 2014/0226239 A1 | 8/2014 | Mihajlovic et al. |
| 2015/0029609 A1 | 1/2015 | Kamiguchi et al. |
| 2015/0030886 A1 | 1/2015 | Shirotori et al. |
| 2015/0035524 A1 | 2/2015 | Sasaki et al. |
| 2015/0070799 A1 | 3/2015 | Dimitrov et al. |
| 2015/0070800 A1 | 3/2015 | Dimitrov et al. |
| 2015/0287426 A1 | 10/2015 | Mihajlovic et al. |
| 2015/0302872 A1 | 10/2015 | Singleton et al. |
| 2016/0035377 A1 | 2/2016 | Kamiguchi et al. |
| 2016/0099014 A1 | 4/2016 | Shirotori et al. |
| 2016/0099015 A1 | 4/2016 | Kamiguchi et al. |
| 2016/0154071 A1 | 6/2016 | Sasaki |
| 2017/0011758 A1 | 1/2017 | Deen et al. |
| 2017/0092302 A1 | 3/2017 | Deen et al. |
| 2017/0092305 A1 | 3/2017 | Deen et al. |
| 2017/0287512 A1 | 10/2017 | Deen et al. |
| 2017/0288132 A1 | 10/2017 | Koike |
| 2017/0288133 A1 | 10/2017 | Koike |
| 2018/0351082 A1 | 12/2018 | Sasaki et al. |
| 2018/0358543 A1 | 12/2018 | Le et al. |
| 2019/0296229 A1 | 9/2019 | Koike |

OTHER PUBLICATIONS

"Spin injection and detection in magnetic nanostructures" S. Takahashi and S. Maekawa, Physical Review B 67, 052409 (2003).

"Spin Injection and Nonlocal Spin Transport in Magnetic Nanostructures" S. Takahashi and S. Maekawa, Arxiv0609508 (2005).

Koester, Steven, "Graphene Non-Local Spin Valves for Ultra-Compact Hard Drive Readers", University of Minnesota—Twin Cities, Oct. 2015, 28 pages.

Yang, Tao et al., "Giant spin-accumulation signal and pure spin-current-induced reversible magnetization switching", Letters, Published online: Oct. 5, 2008; doi:10.1038/nphys1095, nature physics, vol. 4, Nov. 2008, www.nature.com/naturephysics, © 2008 Macmillan Publishers Limited, 4 pages.

Jedema, F.J. et al., "Electrical detection of spin precession in a metallic mesoscopic spin valve", Department of Applied Physics and Materials Science Center, University of Groningen, Nijenborgh 4.13, 9747 AG Groningen, The Netherlandsletters to nature, © 2002 Macmillan Magazines Ltd, 4 pages.

Tombros, Nikolaos et al., "Electronic spin transport and spin precession in single graphene layers at room temperature", Letters, nature, vol. 448, Aug. 2, 2007, doi:10.1038/nature06037, 5 pages.

Nomura, Tatsuya et al., "Efficient thermal spin injection in metallic nanostructures", 2017 J. Phys. D: Appl. Phys. 50 465003, Journal of Physics D: Applied Physics, This content was downloaded from IP address 192.55.2.36 on Apr. 22, 2020 at 22:27, 9 pages.

Kamalakar, M. Venkata et al., "Long distance spin communication in chemical vapour deposited graphene", nature communications, Article, Accepted Feb. 24, 2015, Published Apr. 10, 2015, DOI: 10.1038/ncomms7766, www.nature.com/naturecommunications, © 2015 Macmillan Publishers Limited, 8 pages.

Ikhtiar, S. Kasai et al., "Temperature dependence of magneto-transport properties in Co2Fe(Ga0.5Ge0.5)/Cu lateral spin valves", AIP Applied Physics Letter, Applied Physics Letters 108, 062401 (2016); doi: 10.1063/1.4941549, 5 pages.

Wang, W.H. et al., Growth of atomically smooth MgO films on graphene by molecular beam epitaxy, Applied Physics Letters, Appl. Phys. Lett. 93, 183107 (2008); https://doi.org/10.1063/1.3013820, Published Online: Nov. 4, 2008, 4 pages.

Kimura, Takashi, "Lateral Spin Transport (Diffusive Spin Current)", Handbook of Spintronics, DOI 10.1007/978-94-007-7604-3_55-1, © Springer Science+Business Media Dordrecht 2014, 17 pages.

Kimura, T. et al., "Large Spin Accumulation in a Permalloy-Silver Lateral Spin Valve", Physical Review Letters, PRL 99, 196604 (2007), DOI: 10.1103/PhysRevLett.99.196604, PACS Nos. 72.25.Ba, 72.25.Mk, 75.70.Cn, 75.75.+a, 4 pages.

O'Brien, L. et al., "Kondo physics in non-local metallic spin transport devices", nature communications, Article, Accepted Apr. 22, 2014, Published May 29, 2014, DOI: 10.1038/ncomms4927, www.nature.com/naturecommunications, © 2014 Macmillan Publishers Limited, 9 pages.

O'Brien, L. et al., "Interdiffusion-controlled Kondo suppression of injection efficiency in metallic nonlocal spin valves", Physical Review B 93, 014413 (2016), DOI: 10.1103/PhysRevB.93.014413, © 2016 American Physical Society, 7 pages.

Hu, Jiaxi et al., "Scaling of the Nonlocal Spin and Baseline Resistances in Graphene Lateral Spin Valves", Manuscript Revised on Sep. 17, 2019, 8 pages.

Bass, Jack et al., "Spin-diffusion lengths in metals and alloys, and spin-flipping at metal/metal interfaces: an experimentalist's critical

(56) References Cited

OTHER PUBLICATIONS review", IOP Publishing, Journal of Physics: Condensed Matter, J. Phys.: Condens. Matter 19 (2007) 183201 (41pp), doi:10.1088/0953-8984/19/18/183201, Published Apr. 4, 2007 Online at stacks.iop.org/JPhysCM/19/183201 , 42 pages.

Yamada, Masaki et al., "Scalability of Spin Accumulation Sensor", IEEE Transactions on Magnetics, vol. 49, No. 2, Feb. 2013, 0018-9464/$31.00 © 2013 IEEE, 5 pages.

Gurram M. et al., "Bias induced up to 100% spin-injection and detection polarizations in ferromagnet/bilayerhBN/graphene/hBN heterostructures", Nature Communications Article, DOI: 10.1038/s41467-017-00317-w, © The Author(s) 2017.

Vedyayev et al., "Non-local signal and noise in T-shape lateral spin-valve structures", Physical Review Applied, American Physical Society, HAL Id:hal-01970254, https://hal.archives-ouvertes.fr/hal-01970254, Submitted on Jan. 4, 2019.

O'Brien, L. et al., "Kondo physics in non-local metallic spin transport devices", 2014.

Stejskal, O. et al., "Optimization of spin injection and spin detection in lateral nanostructures by geometrical means", Journal of Magnetism and Magnetic Materials 414 (2016) 132-143, http://dx.doi.org/10.1016/j.jmmm.2016.04.051, Accepted Apr. 17, 2016.

Johnson, Mark, "Overview of Spin Transport Electronics in Metals", Invited Paper, Digital Object Identifier 10.1109/JPROC.2003.811808, Proceedings of the IEEE, vol. 91, No. 5, May 2003.

Casanova F., et al., "Control of spin injection by direct current in lateral spin valves", Physical Review B 79, 184415 2009, DOI: 10.1103/PhysRevB.79.184415, © 2009 The American Physical Society.

Villamor E., et al., "Temperature dependence of spin polarization in ferromagnetic metals using lateral spin valves", Physical Review B 88, 184411 (2013), DOI: 10.1103/PhysRevB.88.184411, © 2013 American Physical Society.

Volmer F., "Role of MgO barriers for spin and charge transport in Co/MgO/graphene nonlocal spin-valve devices", Physical Review B 88, 161405(R) (2013), DOI: 10.1103/PhysRevB.88.161405, © 2013 American Physical Society.

Watts, J.D., et al., "Room temperature spin Kondo effect and intermixing in Co/Cu non-local spin valves", Applied Physics Letters 110, 222407 (2017); https://doi.org/10.1063/1.4984896, Submitted: Apr. 11, 2017; Accepted: May 19, 2017; Published Online: Jun. 1, 2017.

Hu, J., "Scaling of the Nonlocal Spin and Baseline Resistances in Graphene Lateral Spin Valves", IEEE Transactions on Electron Devices, vol. 66, No. 11, Nov. 2019.

Vedyayev, A., et al., "Nonlocal Signal and Noise in T-Shaped Lateral Spin-Valve Structures", Physical Review Applied 10, 064047 (2018), DOI: 10.1103/PhysRevApplied.10.064047, © 2018 American Physical Society.

Nomura, T. et al., "Geometrical dependence of spin current absorption into a ferromagnetic nanodot", Journal of Applied Physics 120, 142121 (2016); https://doi.org/10.1063/1.4961975, Submitted: Apr. 29, 2016; Accepted: Aug. 18, 2016; Published Online: Sep. 2, 2016.

Kimura, T., et al, "Spin-dependent boundary resistance in the lateral spin-valve structure", Applied Physics Letters 85, 3501 (2004); https://doi.org/10.1063/1.1805698, Submitted: Apr. 2, 2004; Accepted: Aug. 15, 2004; Published Online: Oct. 22, 2004.

Erekhinsky, M et al., "Spin-dependent Seebeck effect in non-local spin valve devices", Applied Physics Letters 100, 212401 (2012); https://doi.org/10.1063/1.4717752, Submitted: Mar. 20, 2012; Accepted: Apr. 27, 2012; Published Online: May 21, 2012.

Idzuchi, H et al., "Spin transportinnon-magneticnanostructuresinducedbynon-local spin injection", Invited review, PhysicaE68(2015)239-263, Accepted on Nov. 28, 2014.

Jedema, F.J. et al., "Electrical spin injection and accumulation at room temperature in an all-metal mesoscopic spin valve", Department of Applied Physics and Materials Science Center, University of Groningen, Nijenborgh 4.13, 9747 AG Groningen, The Netherlands, Letter to Nature, vol. 410, 15 Mar. 15, 2001, © 2001 Macmillan Magazines Ltd, 4 pages.

Drogeler, M., et al., "Spin Lifetimes Exceeding 12 ns in Graphene Nonlocal Spin Valve Devices", Nano Letters, 2016, 16, 3533-3539 DOI: 10.1021/acs.nanolett.6b00497, Revised: May 1, 2016, Published: May 23, 2016, © 2016 American Chemical Society.

Erekhinsky, M et al., "Surface enhanced spin-flip scattering in lateral spin valves", Applied Physics Letters, 96, 022513 (2010); https://doi.org/10.1063/1.3291047, Submitted: Jul. 2, 2009, Accepted: Dec. 10, 2009; Published Online: Jan. 14, 2010.

S. Kasai, I et al., "Temperature dependence of magneto-transport properties in Co2Fe(Ga0.5Ge0.5)/Cu lateral spin valves", Applied Physics Letters, 108, 062401 (2016); https://doi.org/10.1063/1.4941549, Submitted: Sep. 16, 2015; Accepted: Jan. 27, 2016; Published Online: Feb. 8, 2016.

Thermo-electric effect in a nano-sized crossed Permalloy/Cu junction under high bias current, Applied Physics Letters, 103, 132408 (2013); https://doi.org/10.1063/1.4822330, Submitted: Jun. 15, 2013; Accepted: Sep. 10, 2013; Published Online: Sep. 25, 2013.

Iwasaki, H. et al., "All-Metallic Non-Local Spin-Valves with High Output", Study, TMRC2014 H1, Aug. 11, 2014, © 2014 Toshiba Corporation.

Han, W. et al., "Tunneling Spin Injection into Single Layer Graphene", Physical Review Letter, PRL 105, 167202 (2010), DOI: 10.1103/PhysRevLett.105.167202, Published Oct. 12, 2010.

Tseng P. et al., "Ultra-giant magnetoresistance in graphene-based spin valves with gatecontrolled potential barriers", 2019 New Journal of Physics 21 113035, https://doi.org/10.1088/1367-2630/ab531f, Published Nov. 18, 2019.

Ohno, H. et al., "Spintronics", Scanning the Issue, Proceedings of the IEEE, Institute of Electrical and Electronics Engineers, vol. 104, No. 5, Digital Object Identifier: 10.1109/JPROC.2016.2601163, Oct. 2016.

Lee et al., "Emerging Three-Terminal Magnetic Memory Devices", Invited Paper, Proceedings of the IEEE, vol. 104, No. 10, Digital Object Identifier: 10.1109/JPROC.2016.2543782, Oct. 2016.

Wang, K. et al., "Electric-Field Control of Spin-Orbit Interaction for Low-Power Spintronics", Invited Paper, Proceedings of the IEEE, vol. 104, No. 10, Digital Object Identifier: 10.1109/JPROC.2016.2573836, Oct. 2016.

Fullerton, E. et al., "Spintronics, Magnetoresistive Heads, and the Emergence of the Digital World", Invited Paper, Proceedings of the IEEE, vol. 104, No. 10, Digital Object Identifier: 10.1109/JPROC.2016.2567778, Oct. 2016.

Apalkov, D. et al., "Magnetoresistive Random Access Memory", Invited Paper, Proceedings of the IEEE, vol. 104, No. 10, Digital Object Identifier: 10.1109/JPROC.2016.2590142, Oct. 2016.

Hanyu, T. et al., "Standby-Power-Free Integrated Circuits Using MTJ-Based VLSI Computing", Invited Paper, Proceedings of the IEEE, vol. 104, No. 10, Digital Object Identifier: 10.1109/JPROC.2016.2574939, Oct. 2016.

Freitas, P. et al., "Spintronic Sensors", Invited Paper, Proceedings of the IEEE, vol. 104, No. 10, Digital Object Identifier: 10.1109/JPROC.2016.2578303, Oct. 2016.

Uchida, K. et al. "Thermoelectric Generation Based on Spin Seebeck Effects", Invited Paper, Proceedings of the IEEE, vol. 104, No. 10, Digital Object Identifier: 10.1109/JPROC.2016.2535167, Oct. 2016.

Chen, T., "Spin-Torque and Spin-Hall Nano-Oscillators", Invited Paper, Proceedings of the IEEE, vol. 104, No. 10, Digital Object Identifier: 10.1109/JPROC.2016.2554518, Oct. 2016.

Ohno, H. et al., "Spintronics", Special Issue, Contents, Proceedings of the IEEE, vol. 104, No. 10, Oct. 2016.

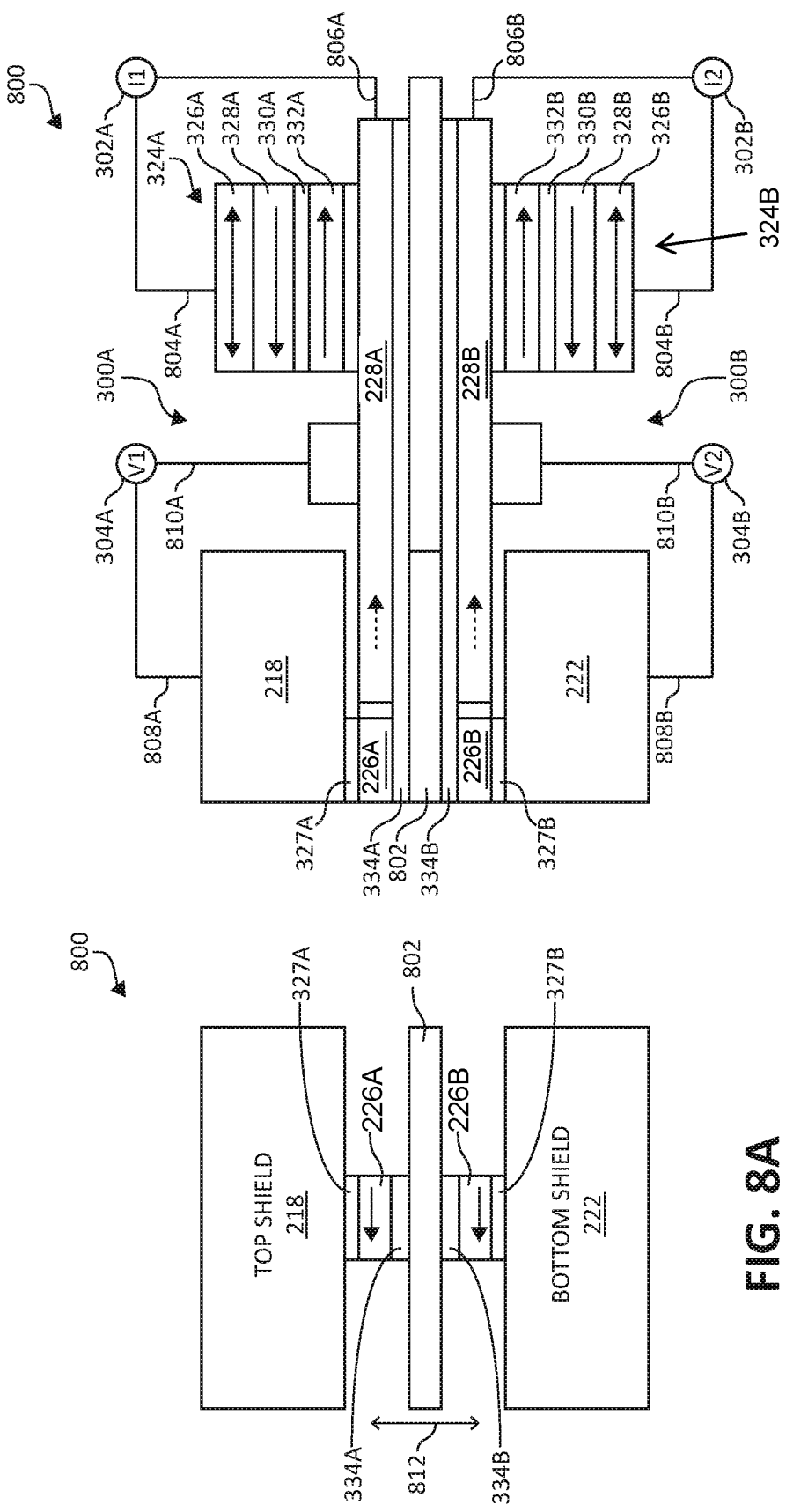

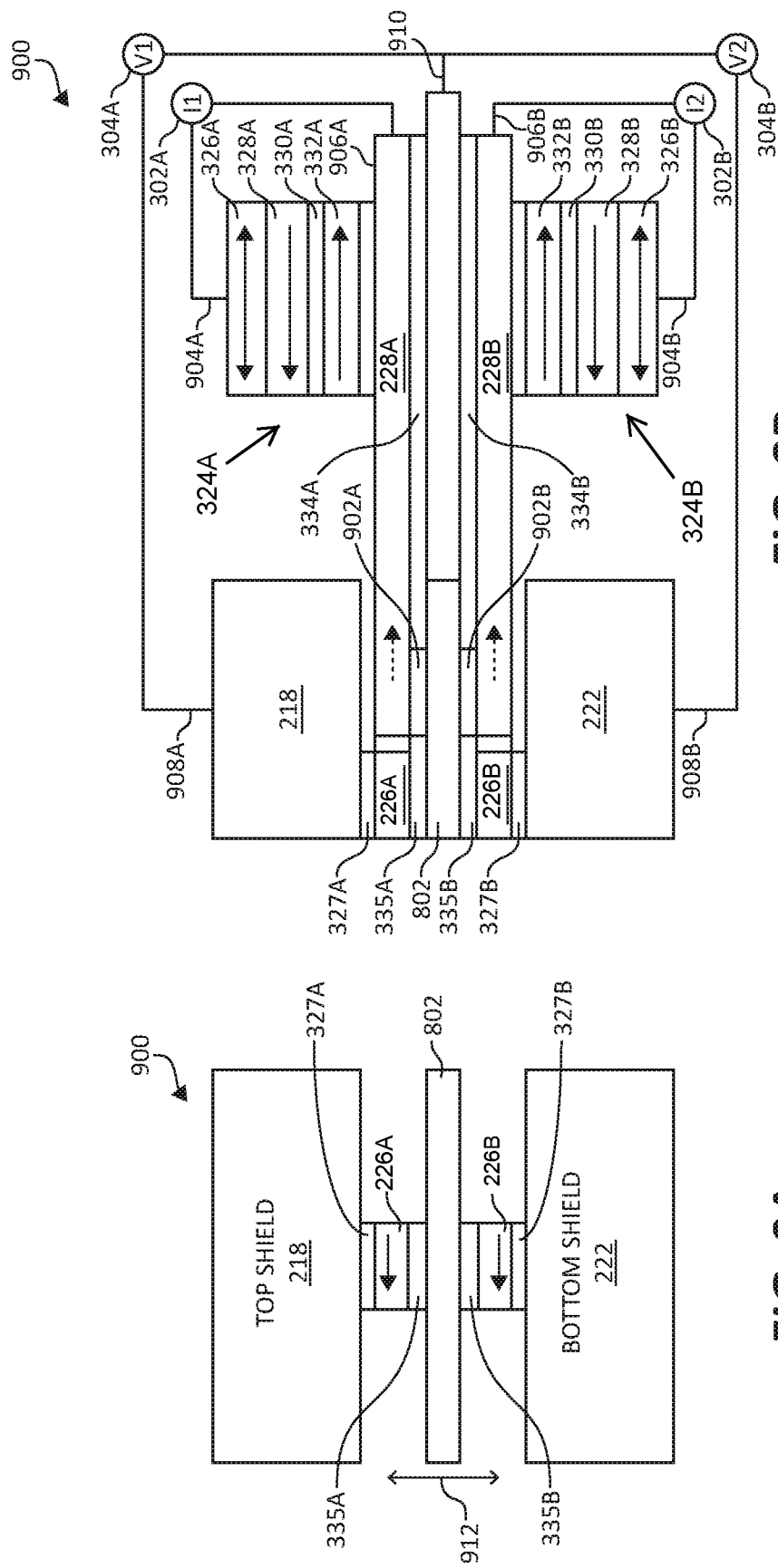

NON-LOCAL SPIN VALVE SENSOR FOR HIGH LINEAR DENSITY

CROSS-REFERENCE TO RELATED APPLICATION

This is a continuation of U.S. application Ser. No. 17/145,909 which was filed on Jan. 11, 2021, and is incorporated herein by reference in its entirety for all purposes.

SUMMARY

In one embodiment, a non-local spin valve (NLSV) sensor is provided. The NLSV sensor includes a bearing surface and a detector located proximate to the bearing surface. The NLSV sensor also includes a channel layer located behind the detector relative to the bearing surface, and in a substantially same plane as the detector. The channel layer has a front end that is proximate to the detector and a rear end that is distal to the detector. The NLSV sensor further includes first and second spin injectors, with the first spin injector located proximate to the rear end of the channel layer and positioned above the channel layer, and the second spin injector located proximate the rear end of the channel layer and positioned below the channel layer.

In another embodiment, a multi-sensor reader within a single recording head is provided. The multi-sensor reader includes a top shield and a bottom shield. The multi-sensor reader also includes a plurality of NLSV sensors interposed between the top shield and the bottom shield. Each of the plurality of NLSV sensors includes a detector located proximate to a bearing surface, and a channel layer located behind the detector relative to the bearing surface, and in a substantially same plane as the detector. The channel layer has a front end that is proximate to the detector and a rear end that is away from the detector. Each of the plurality of NLSV sensors also includes a spin injector located away from the bearing surface and proximate to a rear end of the channel layer. The multi-sensor reader further includes a single middle shield located between two of the plurality of NLSV sensors.

In yet another embodiment, a method is provided. The method includes selecting first design parameter values for a spin injector and for a first interface resistance between the spin injector and a channel layer. The method also includes selecting second design parameter values for a detector and for a second interface resistance between the detector and the channel layer. The method further includes selecting third design parameter values for the channel layer such that the third design parameters comport with the first design parameter values and the second design parameter values. The selection of the third design parameter values includes measuring different detector-channel voltage values for different thickness values for the channel layer between a predetermined low thickness value and a predetermined high thickness value. The method also includes selecting a thickness value of the different thickness values that provides a highest detector-channel voltage value of the measured different detector-channel voltage values.

Other features and benefits that characterize embodiments of the disclosure will be apparent upon reading the following detailed description and review of the associated drawings.

BRIEF DESCRIPTION OF THE DRAWINGS

FIG. 8A is a bearing surface view of a multi-NLSV or multi-sensor magnetic recording (MSMR) reader in accordance with one embodiment.

FIG. 8B is a side view of the multi-NLSV reader of FIG. 8A.

FIG. 9A is a bearing surface view of a multi-NLSV or MSMR reader in accordance with one embodiment.

FIG. 9B is a side view of the multi-NLSV reader of FIG. 9A.

DETAILED DESCRIPTION OF ILLUSTRATIVE EMBODIMENTS

Magnetic reader embodiments described below relate to non-local spin valve (NLSV) sensors or readers that include one or more spin injectors (sometimes simply referred to herein an injector or injectors), a detector and a channel layer substantially extending from the spin injector(s) to the detector. The spin injector(s) inject electron spins into the channel layer. The spins are diffused down the channel layer to the detector. In some embodiments, the channel layer and the detector are substantially in a same plane to provide a large reduction in shield-to-shield spacing in the reader. Prior to providing additional details regarding the different embodiments, a description of an illustrative operating environment is provided below.

Figure 1:
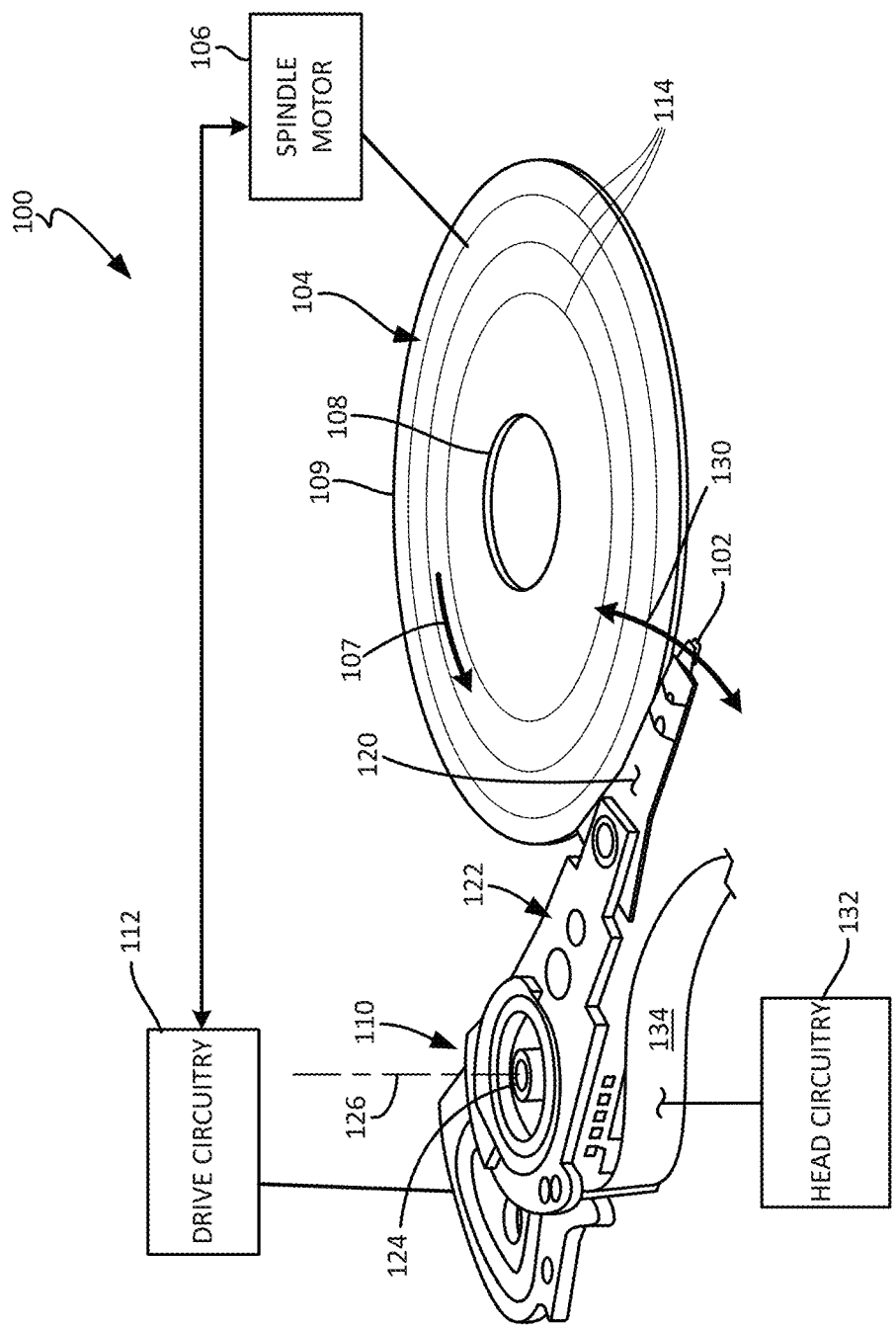
FIG. 1 is a perspective view of a data storage system.

FIG. 1 shows an illustrative operating environment in which certain specific embodiments disclosed herein may be incorporated. The operating environment shown in FIG. 1 is for illustration purposes only. Embodiments of the present disclosure are not limited to any particular operating environment such as the operating environment shown in FIG. 1. Embodiments of the present disclosure are illustratively practiced within any number of different types of operating environments.

It should be noted that like reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

It will be understood that, when an element is referred to as being "connected," "coupled," or "attached" to another element, it can be directly connected, coupled or attached to the other element, or it can be indirectly connected, coupled, or attached to the other element where intervening or intermediate elements may be present. In contrast, if an element is referred to as being "directly connected," "directly coupled" or "directly attached" to another element, there are no intervening elements present. Drawings illustrating direct connections, couplings or attachments between elements also include embodiments, in which the elements are indirectly connected, coupled or attached to each other.

FIG. 1 is a schematic illustration of a data storage device 100 including a data storage medium and a head for reading data from and/or writing data to the data storage medium. Data storage device 100 may be characterized as a hard disc drive (HDD). In data storage device 100, head 102 is positioned above storage medium 104 to read data from and/or write data to the data storage medium 104. In the embodiment shown, the data storage medium 104 is a rotatable disc or other magnetic storage medium that includes a magnetic storage layer or layers. For read and write operations, a spindle motor 106 (illustrated schematically) rotates the medium 104 as illustrated by arrow 107 and an actuator mechanism 110 positions the head 102 relative to data tracks 114 on the rotating medium 104 between an inner diameter 108 and an outer diameter 109. Both the spindle motor 106 and actuator mechanism 110 are connected to and operated through drive circuitry 112 (schematically shown). The head 102 is coupled to the actuator mechanism 110 through a suspension assembly which includes a load beam 120 connected to an actuator arm 122 of the mechanism 110 for example through a swage connection. Although FIG. 1 illustrates a single load beam 120 coupled to the actuator mechanism 110, additional load beams 120 and heads 102 can be coupled to the actuator mechanism 110 to read data from or write data to multiple discs of a disc stack. The actuator mechanism 110 is rotationally coupled to a frame or deck (not shown) through a bearing 124 to rotate about axis 126. Rotation of the actuator mechanism 110 moves the head 102 in a cross track direction as illustrated by arrow 130.

The head 102 includes one or more transducer elements (not shown in FIG. 1) coupled to head circuitry 132 through flex circuit 134. Details regarding elements of a head such as 102 are provided below in connection with FIG. 2.

Figure 2:
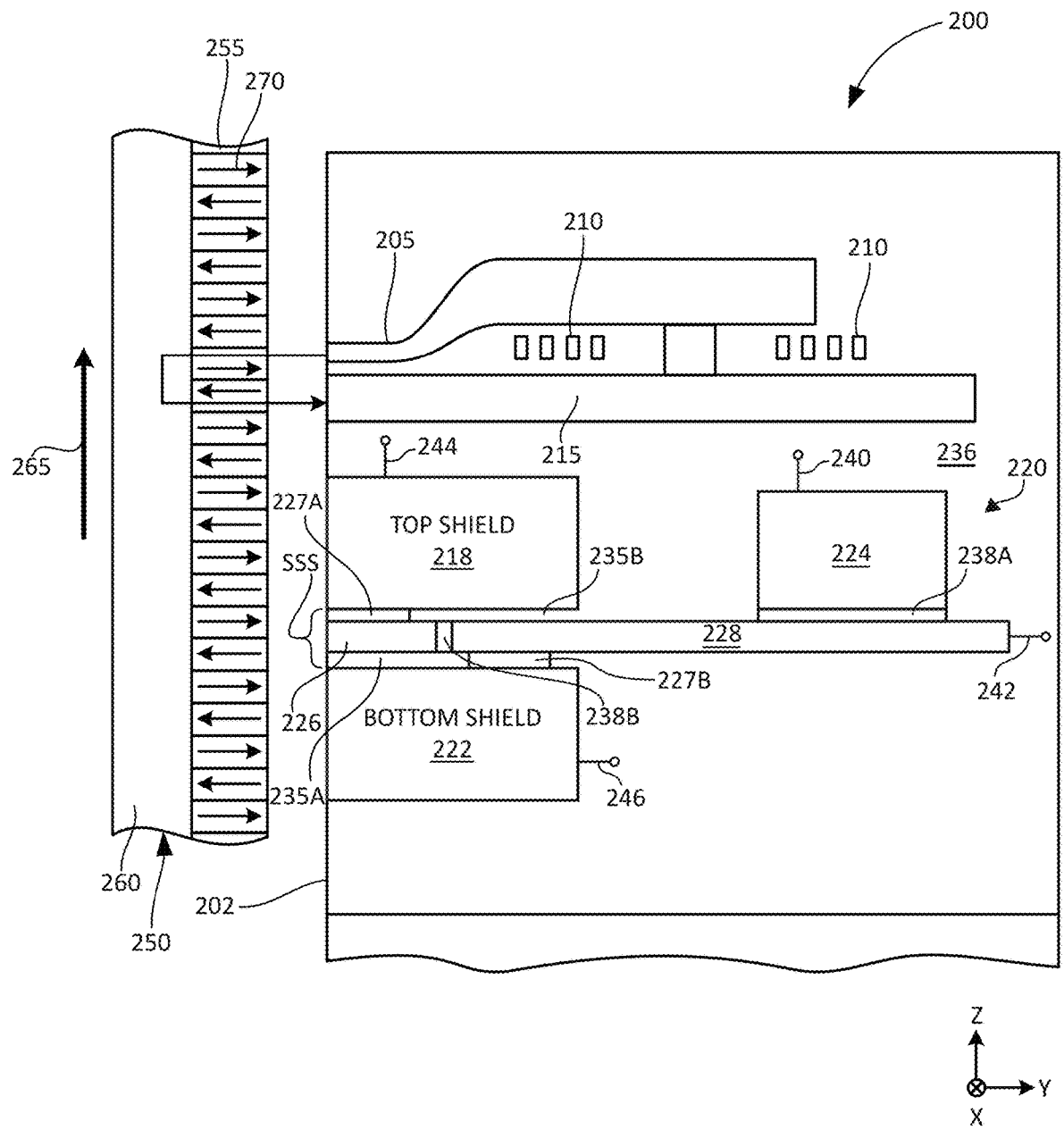
FIG. 2 is a schematic diagram of a cross-section of one embodiment of a recording head that reads from and writes to a storage medium.

FIG. 2 is a schematic diagram showing a cross-sectional view of portions of a recording head 200 and a data storage medium 250 taken along a plane substantially normal to a plane of a bearing surface (for example, an air bearing surface (ABS)) 202 of recording head 200. The recording head elements shown in FIG. 2 are illustratively included in a recording head such as recording head 102 of FIG. 1. Medium 250 is illustratively a data storage medium such as medium 104 in FIG. 1. Those skilled in the art will recognize that recording heads and recording media commonly include other components. Embodiments of the present disclosure are not limited to any particular recording heads or media. Embodiments of the present disclosure may be practiced in different types of recording heads and media.

Recording head 200 includes a write pole 205, a magnetization coil 210, a return pole 215, a top shield 218, a read transducer 220, a bottom shield 222 and a wafer overcoat 236. Storage medium 250 includes a recording layer 255 and an underlayer 260. Storage medium 250 rotates in the direction shown by arrow 265. Arrow 265 is illustratively a direction of rotation such as arrow 107 in FIG. 1.

In an embodiment, electric current is passed through coil 210 to generate a magnetic field. The magnetic field passes from write pole 205, through recording layer 255, into underlayer 260, and across to return pole 215. The magnetic field illustratively records a magnetization pattern 270 in recording layer 255. Read transducer 220 senses or detects magnetization patterns in recording layer 255, and is used in retrieving information previously recorded to layer 255.

In the embodiment shown in FIG. 2, read transducer 220 is a NLSV sensor. NLSV sensor 220 includes a spin injector 224, a detector 226 and a channel layer 228. Top shield 218 and bottom shield 222 may also be considered to be a part of the NSLV sensor 220.

The spin injector 224 may include an electrically conductive, magnetic layer (not separately shown) that has a magnetization that is pinned in a direction (preferably perpendicular to the bearing surface 202). Pinning of the magnetization of the pinned magnetic layer may be achieved by, for example, exchange coupling with a layer of antiferromagnetic material (not separately shown). Also, in some embodiments, a synthetic antiferromagnetic (SAF) structure may be utilized for the spin injector 224.

The detector 226 may include a magnetic, electrically conductive layer having a magnetization that is free to move in response to a magnetic field, and can therefore be referred to herein as a free layer (FL). Injector 224 and detector 226 may each be separated from channel layer 228 by a thin electrically insulating tunnel barrier layer 238A, 238B, respectively.

The portion of NLSV sensor 220 proximate to the bearing surface 202 does not include relatively thick SAF and antiferromagnetic (AFM) stacks that are typically present in, for example, current perpendicular-to-plane (CPP) Tunnel Junction Magnetoresistive (TMR) sensors. Further, unlike conventional NLSV sensors in which both the injector and the detector are each on the top or the bottom of the channel layer, in NLSV sensor 220, detector 226 is positioned in a same plane as channel layer 228. The position of detector 226 in the same plane as channel layer 228 yields a spacing between top shield 218 and bottom shield 222, denoted by SSS (shield-to-shield spacing), that is slightly more than the thickness of channel layer 228 by approximately an insulation layer 235A that separates bottom shield 222 from detector 226. Insulation layer 235A is included to prevent shorting between detector 226 and channel layer 228. An insulation layer 235B separates top shield 218 from channel layer 228. Electrical connector/contact 227A may be provided between top shield 218 and detector 226, and electrical connector/contact 227B may be provided between bottom shield 227B and channel layer 228.

For allowing a detection current to flow to detector 226, spin injector 224 and channel layer 228 are connected to a current source (not shown in FIG. 2) via terminals 240 and 242, respectively. Detector 226 and channel layer 228 are connected to a suitable voltage measuring device (not shown in FIG. 2) via terminals 244 and 246, respectively.

First, the current from the current source is made to flow through the spin injector 224 and through a portion of the channel layer 228. This flow of current causes electron spins to accumulate in channel layer 228, which then diffuse through the channel layer 228 to the detector 226.

When the spins are transported to the detector 226, an electric potential difference, which varies depending upon the detector 226 magnetization which responds to an external magnetic field, appears between the detector 226 and the channel layer 228 (e.g., across barrier layer 238B). The voltage measuring device detects an electric potential difference appearing between the detector 226 and the channel layer 228. In this manner, the NLSV sensor 220 can be applied as an external magnetic field sensor for detecting bits stored on a magnetic data storage medium such as 250. Different NLSV sensor embodiments are described below in connection with FIGS. 3A-9B.

Figure 3A:
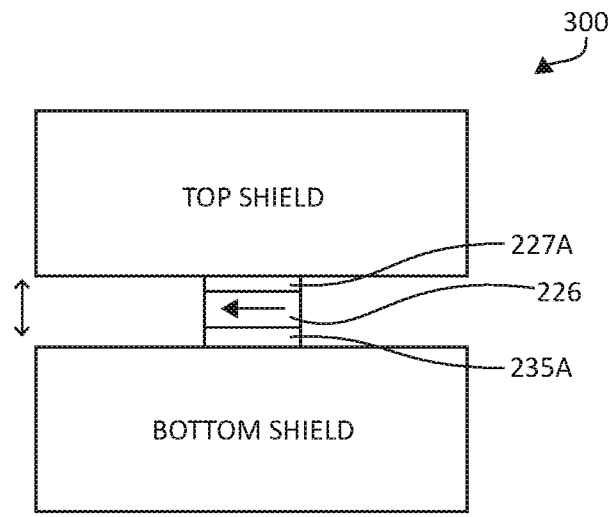
FIG. 3A is bearing surface view of a non-local spin valve (NLSV) sensor in accordance with one embodiment.
Figure 3B:
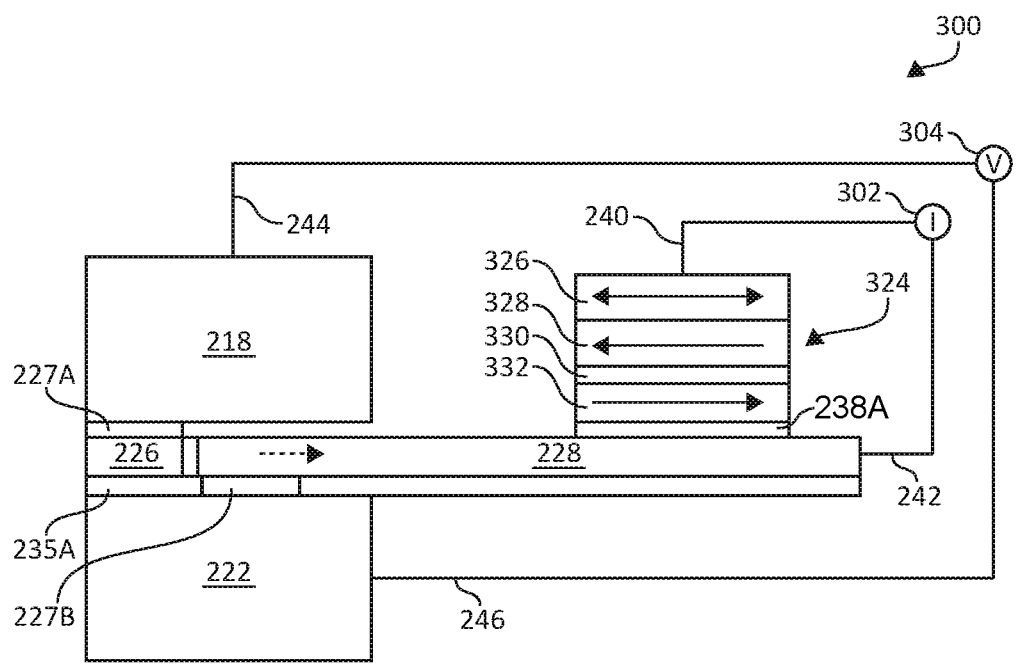
FIG. 3B is a side view of the NLSV sensor of FIG. 3A.

FIG. 3A is a bearing surface view of a NLSV sensor 300 in accordance with one embodiment. FIG. 3B is a side view of NLSV sensor 300. Most elements of NLSV sensor 300 are substantially similar to the elements of NLSV sensor 220 of FIG. 2 described above. Therefore, in the interest of brevity, a description of the substantially similar elements is not repeated in connection with FIGS. 3A and 3B. As can be seen in FIG. 3B, spin injector 324 is a multi-layered structure that includes a SAF structure. Accordingly, spin injector 324 includes a pinning layer (e.g., an antiferromagnetic layer) 326, a pinned layer 328, a thin separation layer 330, which may comprise a metal such as ruthenium (Ru) in some embodiments, and a reference layer 332. The magnetic moments of the pinned layer 328 and the reference layer 332 are generally oriented normal to the bearing surface 202 and anti-parallel to each other. Spin injector 324 and channel layer 228 are connected to a current source 302 via terminals 240 and 242, respectively. Detector 226 and channel layer 228 are electrically connected to a voltage measuring device 304 via terminals 244 and 246, respectively. NLSV sensor 300 operates in a manner similar to NLSV sensor 200 described above in connection with FIG. 2.

Figure 4A:
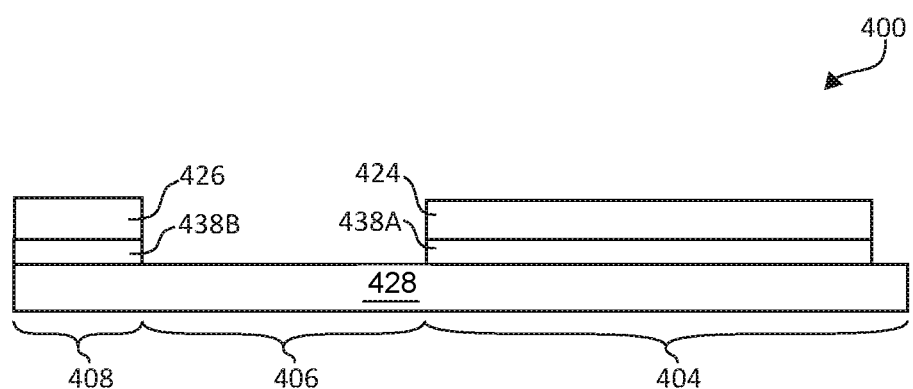
FIG. 4A is a side view of a NLSV sensor in accordance with one embodiment.
Figure 4B:
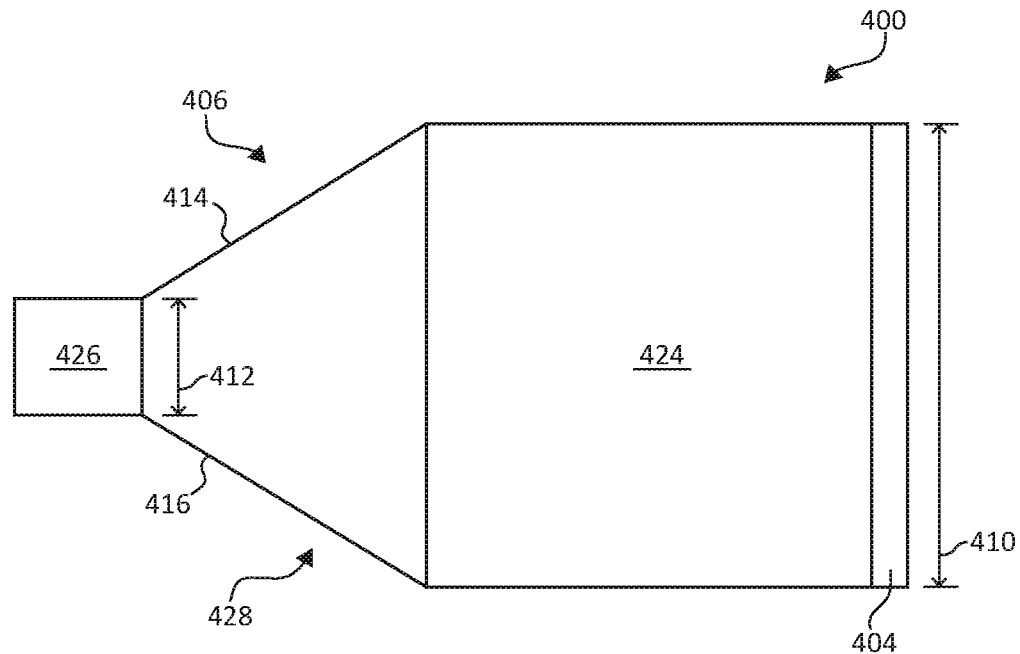
FIG. 4B is a top view of the NLSV sensor of FIG. 4A.

FIG. 4A is a side view of a NLSV sensor 400 in accordance with one embodiment. FIG. 4B is a top view of NLSV sensor 400. NLSV sensor 400 includes a spin injector 424, a detector 426 and a channel layer 428 that extends from injector 424 to detector 426. In the embodiment of FIGS. 4A and 4B, detector 426 is above channel layer 428. In an alternate embodiment, detector 426 may be below channel layer 428. Tunnel barrier layer 438A is included between injector 424 and channel layer 428, and tunnel barrier 438B is included between detector 426 and channel layer 428. To mitigate against resistance that arises due to the inclusion of tunnel barrier 438A, the spin injector may be made larger. Thus, as can be seen in FIG. 4B spin injector 424 is a relatively large area spin injector (e.g., substantially wider than detector 426). The relatively large area spin injector 424 is employed to increase injected spins and leverage a benefit of the tunnel junction of the injector 424 and thereby enhance spin-selectivity and spin-polarized current injected into the NLSV channel while simultaneously avoiding elevated resistance from the tunnel junction. The top view of NLSV sensor 400 in included in FIG. 4B to show the size of the large-area injector 424 compared to the detector 426.

As can be seen in FIG. 4B, channel layer 428 includes a paddle region 404, a flare region 406, and a tip region 408. Paddle region 404 illustratively has a width 410, and tip region 408 illustratively has a width 412. Flare region 406 has a first side 414 and a second side 416 that is not parallel to side 414. Sides 414 and 416 start being spaced apart by width 410 and come closer together until they are spaced apart by width 412 (smaller than 410) as the sides meet tip region 408. Flare region 406 therefore includes two sides 414 and 416 that are tapered going from paddle region 404 to tip region 408. In some embodiments, width 410 may range from tens of nanometers to the micron scale. Also, in such embodiments, width 412 may be tens of nanometers or less. It should be noted that dimensions of widths 410 and 412 and not limited to the examples provided herein and any suitable width dimensions may be used in different embodiments without departing from the scope of the disclosure. In the embodiment shown in FIGS. 4A and 4B, a geometry of injector 424 and tunnel barrier 438A corresponds to a geometry of the paddle region 404 of channel layer 428. However, elements 424, 428 and 438A may be of any suitable shape and the shapes of these elements are not limited to the shapes shown in FIG. 4B.

Figure 5A:
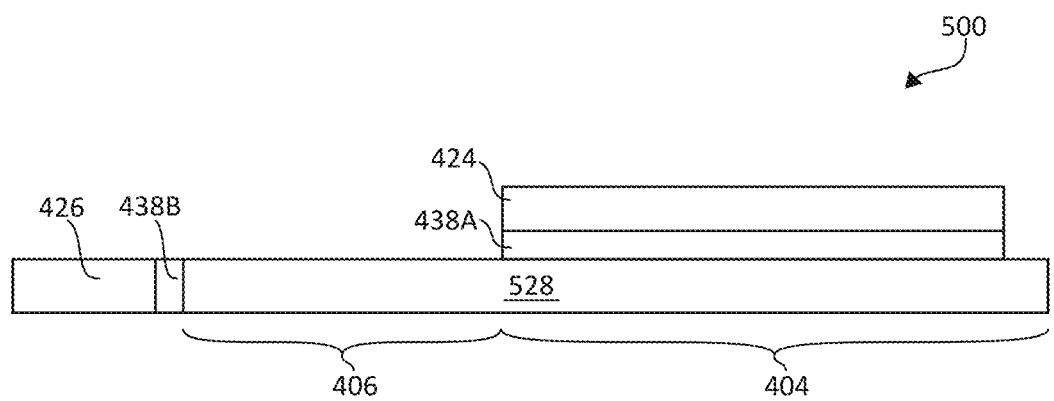
FIG. 5A is a side view of a NLSV sensor in accordance with one embodiment.
Figure 5B:
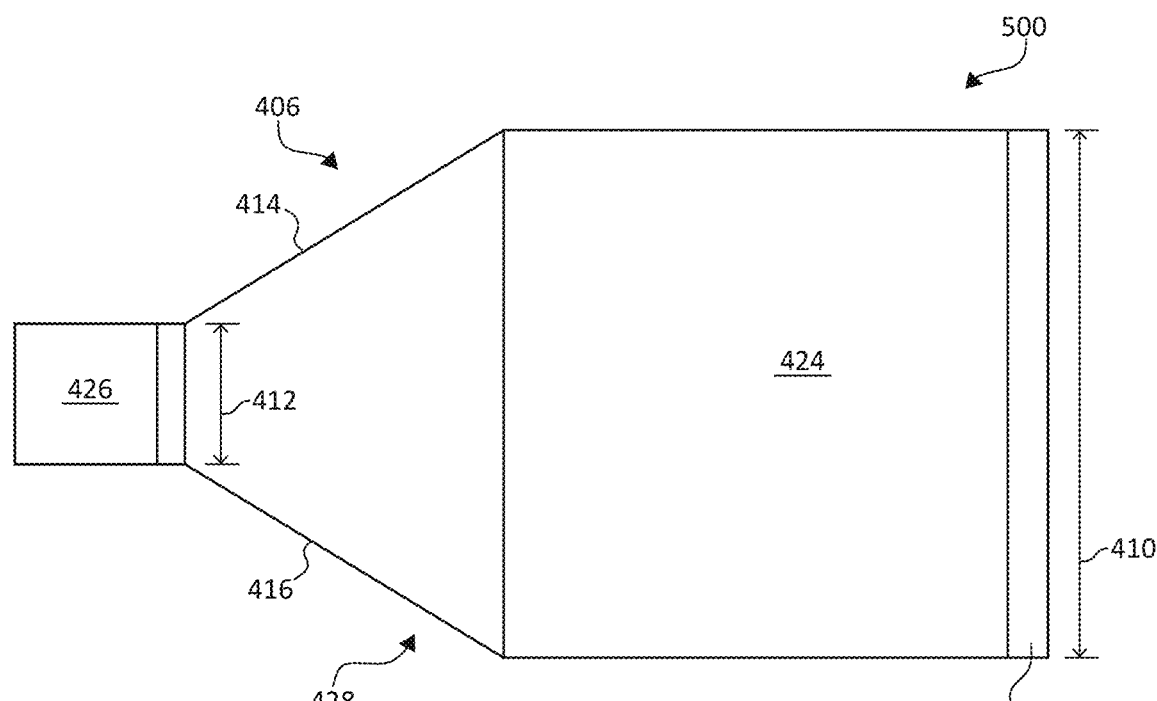
FIG. 5B is a top view of the NLSV sensor of FIG. 5A.

FIG. 5A is a side view of a NLSV sensor 500 in accordance with one embodiment. FIG. is a top view of NLSV sensor 500. Most elements of NLSV sensor 500 are substantially similar to the elements of NLSV sensor 400 of FIGS. 4A and 4B described above. Therefore, in the interest of brevity, a description of the substantially similar elements is not repeated in connection with FIGS. 5A and 5B. In NLSV sensor 500, channel layer 528 does not include a tip region such as 408 in channel layer 428 of FIGS. 4A and 4B. Instead, detector 426 is substantially coplanar with channel layer 528, thereby reducing SSS in a manner shown and described above in connection with FIG. 2.

Figures 6A, 6B:
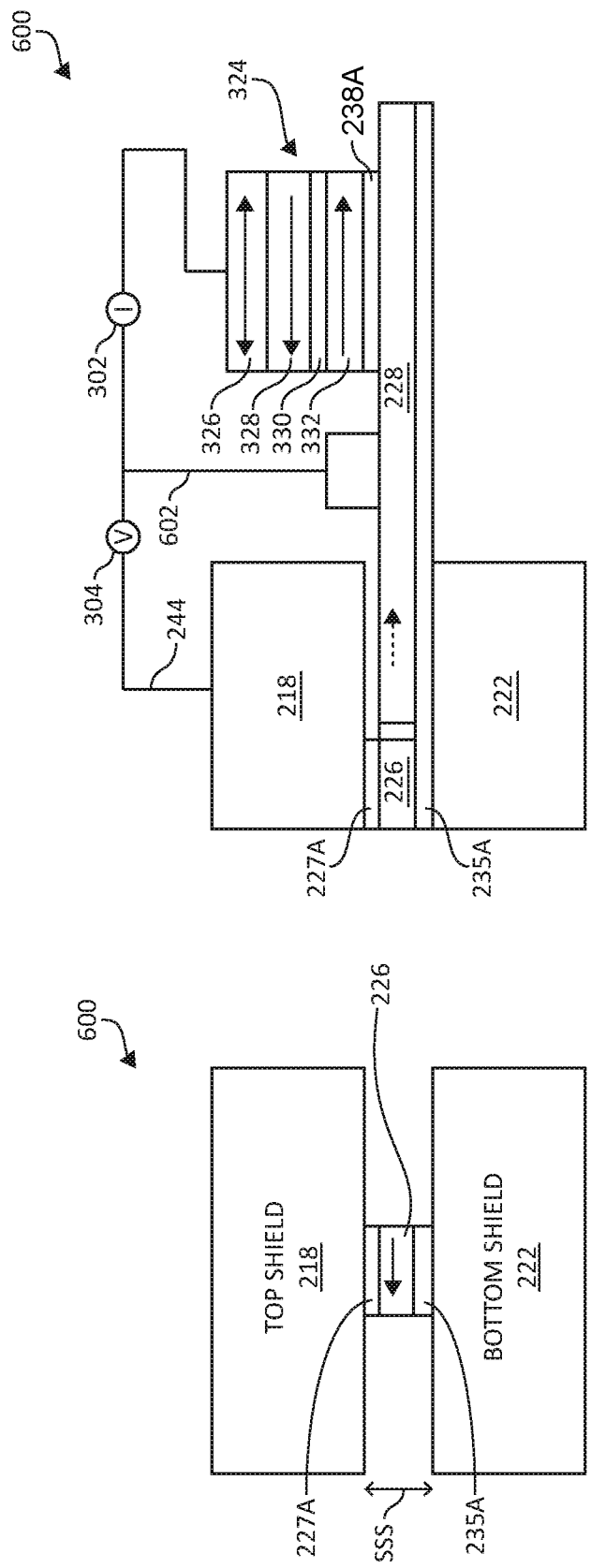
FIGS. 6A and 6B are front and side views, respectively, of a 3-terminal NLSV sensor in accordance with one embodiment.

FIGS. 6A and 6B are front and side views, respectively, of a 3-terminal NLSV sensor 600 in accordance with one embodiment. NLSV sensor 600 is substantially similar to NLSV sensor 300 of FIGS. 3A and 3B. However, in NLSV sensor 600, no terminal is connected to bottom shield 222. Instead, a terminal 602, coupled to channel layer 228, serves as a common terminal to which both current source 302 and voltage measuring device 304 are connected.

Figures 7A, 7B:
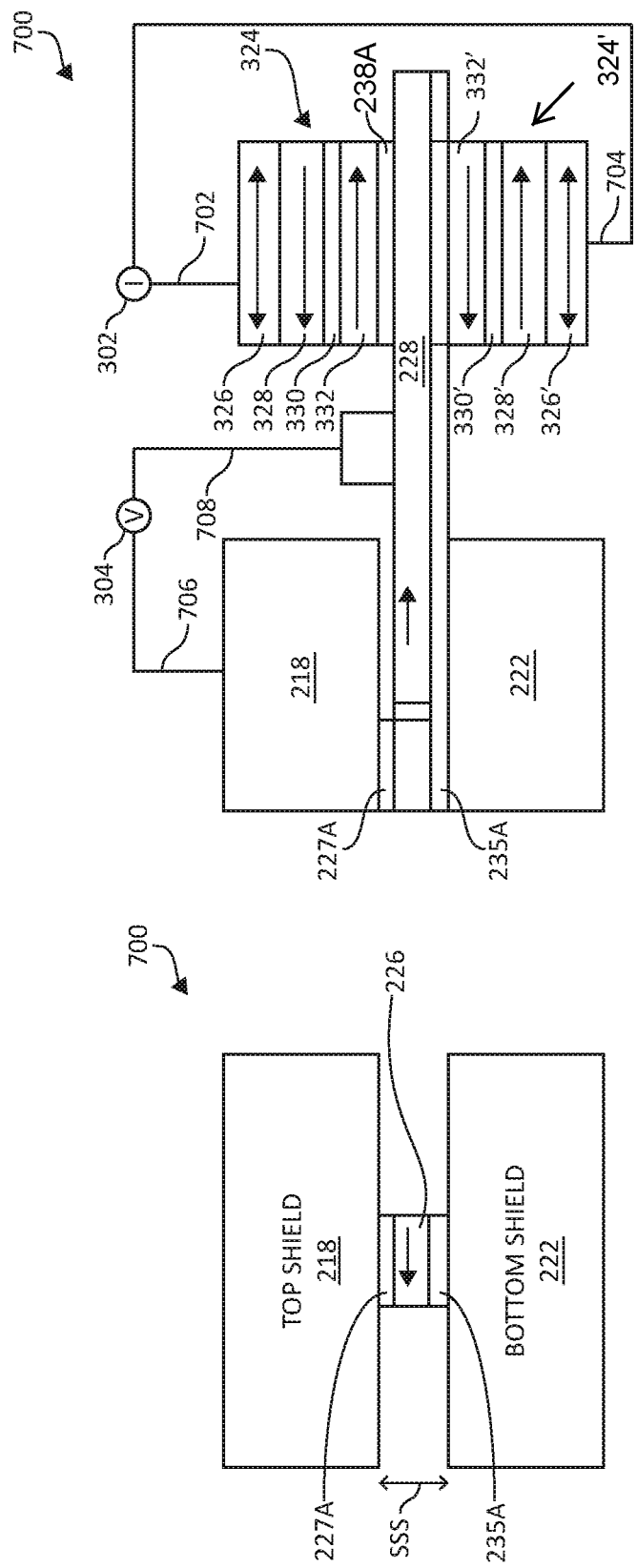
FIGS. 7A and 7B are front and side views, respectively, of a 4-terminal NLSV sensor in accordance with one embodiment.

FIGS. 7A and 7B are front and side views, respectively, of a 4-terminal NLSV sensor 700 in accordance with one embodiment. In addition to a first spin injector 324 of the type shown in FIG. 3B, NLSV sensor 700 includes a second spin injector 324'. As can be seen in FIG. 7B, spin injector 324' is a multi-layered structure that includes a SAF structure. Accordingly, spin injector 324' includes a pinning layer (e.g., an antiferromagnetic layer) 326', a pinned layer 328', a thin separation layer 330', which may comprise a metal such as ruthenium (Ru) in some embodiments, and a reference layer 332'. The magnetic moments of the pinned layer 328' and the reference layer 332' are generally oriented normal to the bearing surface 202 and anti-parallel to each other with reference layer 332' opposite to 332. In the embodiment shown in FIGS. 7A and 7B, spin injectors 324 and 324' are connected to current source 302 via terminals 702 and 704, respectively, and voltage measuring device 304 is connected to detector 226 and channel layer 228 via terminals 706 and 708, respectively. In some embodiments, one or both of injectors 324 and 324' may be large area injectors, and the channel layer may have a geometry similar to channel layer 428 of FIGS. 4A and 4B.

FIG. 8A is a bearing surface view of a multi-NLSV or multi-sensor magnetic recording (MSMR) reader 800 in accordance with one embodiment. FIG. 8B is a side view of multi-NLSV reader 800. As indicated earlier in connection with the description of FIGS. 2, 3A and 3B, NLSV sensors such as 220 and 300 have narrow SSS proximate to a bearing surface such as 202. Therefore, it is a suitable reader design to implement in a multi-sensor configuration where two or more NLSV sensors are stacked on top of each other within a single recording head. One example of a dual-sensor configuration is shown in FIGS. 8A and 8B, which are front and side views, respectively, of MSMR reader 800. The embodiment of reader 800 in FIGS. 8A and 8B includes a top shield 218, a bottom shield 222, a middle shield 802 and NLSV sensors 300A and 300B interposed between top shield 218 and bottom shield 222. NLSV sensor 300A includes an injector 324A, a detector 226A, and a channel 228A in a same plane as detector 226A. Similarly, NLSV sensor 300B includes an injector 324B, a detector 226B and a channel 228B in a same plane as detector 226B. Isolation layers 334A and 334B are included on respective upper and lower sides of middle shield 802. Elements 327A and 327B are electrical connectors/contacts. For allowing a detection current to flow to detector 226A, spin injector 324A and channel layer 228A are connected to a first current source 302A via terminals 804A and 806A, respectively. Detector 226A and channel layer 228A are connected to a first voltage measuring device 304A via terminals 808A and 810A, respectively. Similarly, for allowing a detection current to flow to detector 226B, spin injector 324B and channel layer 228B are connected to a second current source 302B via terminals 804B and 806B, respectively. Detector 226B and channel layer 228B are connected to a second voltage measuring device 304B via terminals 808B and 810B, respectively. Layers 326A and 326B are pinning layers (e.g., an antiferromagnetic layers), layers 328A and 328B are pinned layers, layers 330A and 330B are thin separation layers, and layers 332A and 332B are reference layers.

FIG. 9A is a bearing surface view of a multi-NLSV or MSMR reader 900 in accordance with one embodiment. FIG. 9B is a side view of multi-NLSV reader 900. Most elements of multi-NLSV reader 900 are substantially similar to the elements of multi-NLSV reader 800 of FIGS. 8A and 8B described above. Therefore, in the interest of brevity, a description of the substantially similar elements is not repeated in connection with FIGS. 9A and 9B. In MSMR reader 900, channel layers 228A and 228B are electrically coupled to middle shield 802 by electrical connectors/contacts 902A and 902B, respectively. This enables first and second voltage measuring devices 304A and 304B to be connected to a same terminal 910. Remaining terminal (904A, 906A, 904B, 906B, 908A and 908B) connections are similar to those described above in connection with FIGS. 8A and 8B. Elements 334A, 334B, 335A and 335B are insulators, and elements 327A and 327B are electrical connectors/contacts.

In the multi-sensor configurations, FL-to-FL separation distances 812 and 912 are shown in FIGS. 8A and 9A, respectively. Reducing the FL-to-FL separation enables a multi-sensor reader to be implemented in a high linear density drive and across a wide skew range. Substantially high FL-to-FL separation reduction may be achieved by implementing NLSV-based magnetic readers with channels and detectors in a same plane because, as noted above, they eliminate the thicknesses of SAF and AFM stacks at the bearing surface that are typically present in, for example, CPP TMR readers. Additionally, the relatively thin and uniform mid-shield 802 of FIGS. 8B and 9B may result in a further reduction in FL-to-FL separation. It should be noted that FIGS. 8A-9B are illustrative embodiments of multi-sensor readers and, in other embodiments, more than two sensors may be employed.

It is generally understood that the NLSV signal can be increased by the use of high RA (product of resistance and area) insulators at the interface between the injector-channel (e.g., 238A of FIG. 2) and detector-channel (e.g., 238B of FIG. 2). In practice, for HDD readers, there are constraints which entail the use of a novel, practical approach to increase the NLSV signal. Reasons for such constraints, examples of the constraints, and practical design approaches in view of the constraints are described below.

The detector voltage signal (e.g., signal measured by voltage measuring device 304 of FIG. 3B), $V_s$, is defined as the non-local voltage given by resistance signal×injector current, $R_s \times I$.

A general expression for $R_s$ for a one-dimensional (1-D) case is shown in Equation 1 below.

$$R_s = 4R_N \frac{\left(\frac{P_1}{1-P_1^2}\frac{R_1}{R_N} + \frac{p_F}{1-p_F^2}\frac{R_F}{R_N}\right)\left(\frac{P_2}{1-P_2^2}\frac{R_2}{R_N} + \frac{p_F}{1-p_F^2}\frac{R_F}{R_N}\right)e^{-L/l_N}}{\left(1 + \frac{2}{1-P_1^2}\frac{R_1}{R_N} + \frac{2}{1-p_F^2}\frac{R_F}{R_N}\right)\left(1 + \frac{2}{1-P_2^2}\frac{R_2}{R_N} + \frac{2}{1-p_F^2}\frac{R_F}{R_N}\right)e^{-2L/l_N}},$$ Equation 1 where $R_s$ is the signal resistance, $R_N$ is the spin accumulation resistance of a normal metal channel, $R_F$ is spin accumulation resistance of ferromagnetic electrodes, $R_1$ is resistance of the injector-channel interface, $R_2$ is resistance between the detector-channel interface, $P_1$ is the injector-channel interfacial spin polarization, $P_2$ is the detector-channel interfacial spin polarization, $p_F$ is spin polarization of ferromagnet injector and detector, L is the lateral separation between the injector and detector, and $l_N$ is the spin diffusion length in the normal metal channel.

For conditions of when injector interface resistance ($R_1$) and detector interface resistance ($R_2$) are either both high relative to the channel spin accumulation resistance ($R_N$) or both low relative to the electrodes spin accumulation resistance ($R_F$), the signal resistance can be simply expressed as:

$R_s$ for high injector, detector RA ($R_1, R_2 \gg R_N$)

$$R_s = R_N P_1 P_2 e^{-L/l_N}$$ Equation 2

$R_s$ for low injector, detector RA ($R_1, R_2 \ll R_F$)

$$R_s = R_N[4p_F^2/(1-p_F^2)^2](R_1R_2/R_N^2)[e^{-L/l_N}/(1-e^{-2L/l_N})]$$ Equation 3

In many practical applications there are constraints, and $R_N$ is similar to $R_1$ and $R_2$. Examples of constraints are included below.

Injector electrical reliability is limited by dielectric (e.g., material of barrier 238A of FIG. 2) breakdown, so $V_{bias}$ (voltage value to produce the injector current from the current source (e.g., 302 of FIG. 3B)) may be maintained below a predetermined $V_{bias}$ value (e.g., ~150 millivolts (mV) for MgO).

Injector magnetic stability is limited by spin momentum transfer (SMT) at the injector-channel junction, so the junction current density may be maintained below a predetermined junction current density, $J_{limit}$ (e.g., ~1e8 ampere/square centimeter (A/cm$^2$))

Injector heating may produce stray signals due to thermal spin injection, so injector power may be maintained below a predetermined power limit, $P_{limit}$.

Although a goal may be to increase the injector current for the design, the above-noted constraints mean that the injector current and current density may not be increased without limit. Further, although the detector signal increases with detector-channel junction resistance (e.g., RA of layer 238B of FIG. 2), it may not exceed acceptable preamplifier impedance for high frequency operation. Accordingly, one approach for tuning for high $V_s$ is provided below.

An example design approach to tune for high $V_s$ includes:
1) Injector (Goal: increase injected spin current while maintaining good stability ($<=J_{limit}$) and limited heating ($<=$injector $P_{limit}$)
   Set injector junction bias to a predetermined $V_{bias}$ value/limit.
   Increase injector-channel junction spacer area or injector-channel barrier area as practical for design fabrication.
   Select junction spacer or injector-channel barrier (materials, thickness) to reduce injector junction RA with operating current density$<=J_{limit}$ and power $(V^2/R)<P_{limit}$
   It should be noted that the resistance of an injector itself is generally insignificant compared to the resistance of the interface layer (e.g., barrier layer) between the injector and the channel layer. Thus, when injector junction resistance is used herein, it is essentially the resistance of the barrier layer between the injector and the channel layer.
2) Detector (Goal: increase voltage detected at an acceptable impedance for the preamplifier)
   Set detector area (width×height) for a predetermined cross-track resolution and stability.
   Select detector-channel junction spacer or detector-channel barrier (materials, thickness) to increase detector junction RA<$R_{limit}$ (detector junction resistance limit).
   It should be noted that the resistance of a detector itself is generally insignificant compared to the resistance of the barrier layer between the detector and the channel layer. Thus, when detector junction resistance is used herein, it is essentially the resistance of the barrier layer between the detector and the channel layer.
3) Channel (Goal: increase spin accumulation by tuning normal channel spin resistance for injector and detector spin resistances)
   Choose injector-detector channel spacing less than the channel spin diffusion length and as practical for design fabrication.
   Select channel (material, thickness, geometry) to increase signal $V_s$ with reduced shield-shield spacing.

It should be noted that, in practice, channel spin diffusion length is dependent upon material, process, and thickness.

In one non-limiting example embodiment, the NLSV sensor is designed in the order listed above. The injector is defined first, the detector is engineered in view of the designed injector, and the channel layer is tuned based on the determined injector and detector parameters.

Figure 10A:
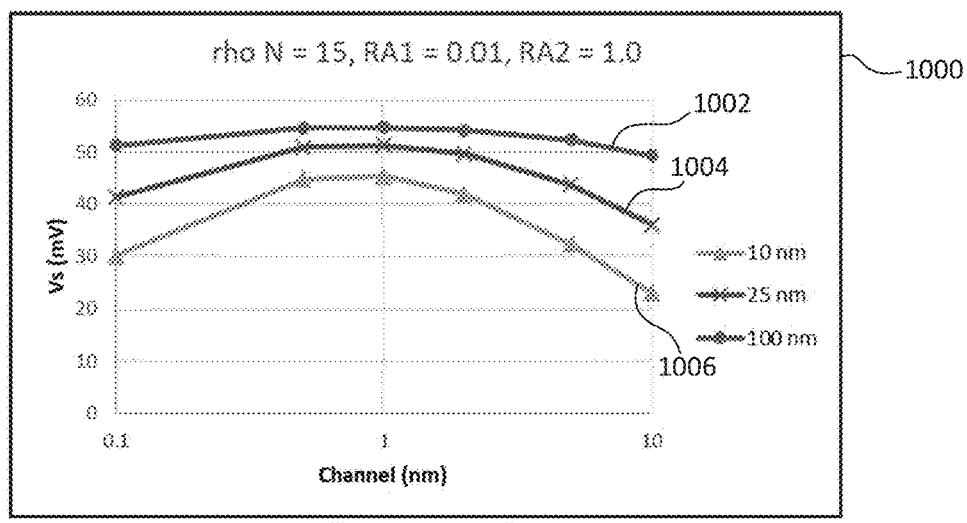
FIGS. 10A-10C are detector voltage signal ($V_s$) versus channel thickness graphs for different injector junction/detector junction resistance area (RA) product values.
Figure 10B:
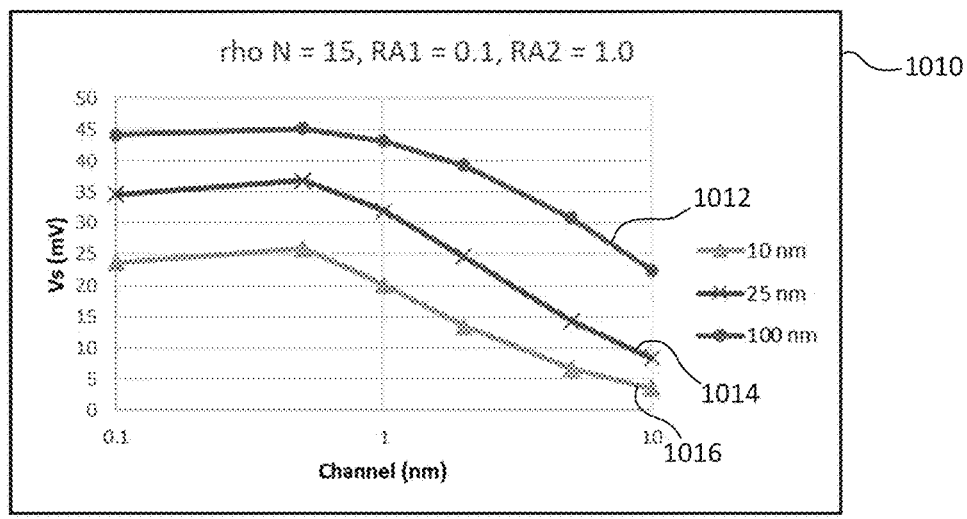
Figure 10C:
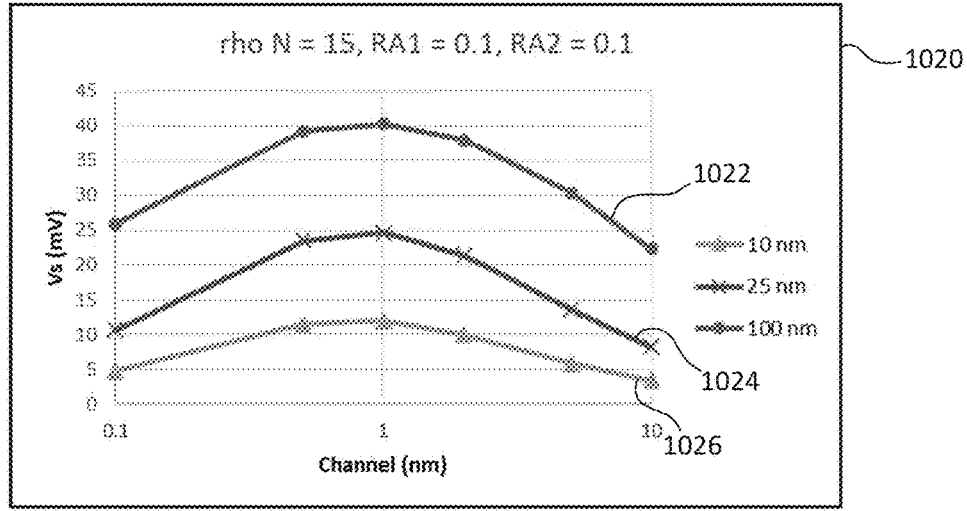

FIGS. 10A-10C are detector voltage signal ($V_s$) versus channel thickness graphs 1000, 1010 and 1020, respectively, for different injector junction/detector junction resistance area (RA) product values. In FIG. 10A, plot 1002 is for a 10 nanometer (nm) injector width, plot 1004 is for a nm injector width and plot 1006 is for a 100 nm injector width. All plots consider a channel length of 200 nm with a spin diffusion length of 200 nm. The following parameter values were employed to obtain the plots 1002, 1004 and 1006:
Injector $V_{bias}$=100 mV.
Detector width×height=10 nm×10 nm
For
  Rho N (resistivity of the channel layer material)=15 microohms·centimeter (µohm·cm)
  Injector junction RA1=0.01 ohnms·micrometer squared (ohm·µm$^2$) ($J_{limit}$=1e9 A/cm$^2$)
  Detector junction RA2=1.0 ohm·µm$^2$ (R (resistance of the detector junction)~10,000 ohm)
$V_s$
  Injector area (width$^2$)=100 nm$^2$, 625 nm$^2$, 10000 nm$^2$
  Channel thickness=0.01 to 10 nm.

In FIG. 10B, plot 1012 is for a 10 nm injector width, plot 1014 is for a 25 nm injector width and plot 1016 is for a 100 nm injector width. The following parameter values were employed to obtain the plots 1012, 1014 and 1016:
Injector $V_{bias}$=100 mV.
Detector width×height=10 nm×10 nm
For
  Rho N=15 µohm·cm
  Injector junction RA1=0.1 ohm·µm$^2$ ($J_{limit}$=1e8 A/cm$^2$)
  Detector junction RA2=1 ohm·µm$^2$ (R~10,000 ohm)
$V_s$
  Injector area (width 2)=100 nm$^2$, 625 nm$^2$, 10000 nm$^2$
  Channel thickness=0.01 to 10 nm.

In FIG. 10C, plot 1022 is for a 10 nm injector width, plot 1024 is for a 25 nm injector width and plot 1026 is for a 100 nm injector width. The following parameter values were employed to obtain the plots 1022, 1024 and 1026:
Injector $V_{bias}$=100 mV.
Detector width×height=10 nm×10 nm
For
  Rho N=15 µohm·cm
  Injector junction RA1=0.1 ohm·µm$^2$ ($J_{limit}$=1e8 A/cm$^2$)
  Detector junction RA2=0.1 ohm·µm$^2$ (R~1000 ohm)
$V_s$
  Injector area (width)=100 nm$^2$, 625 nm$^2$, 10000 nm$^2$
  Channel thickness=0.01 to 10 nm In FIGS. 10A-10C, $V_s$ increases by tuning channel resistance (e.g., Rho N/thickness) with injector and detector resistance. Also, $V_s$ increases with detector junction area.

Figure 11A:
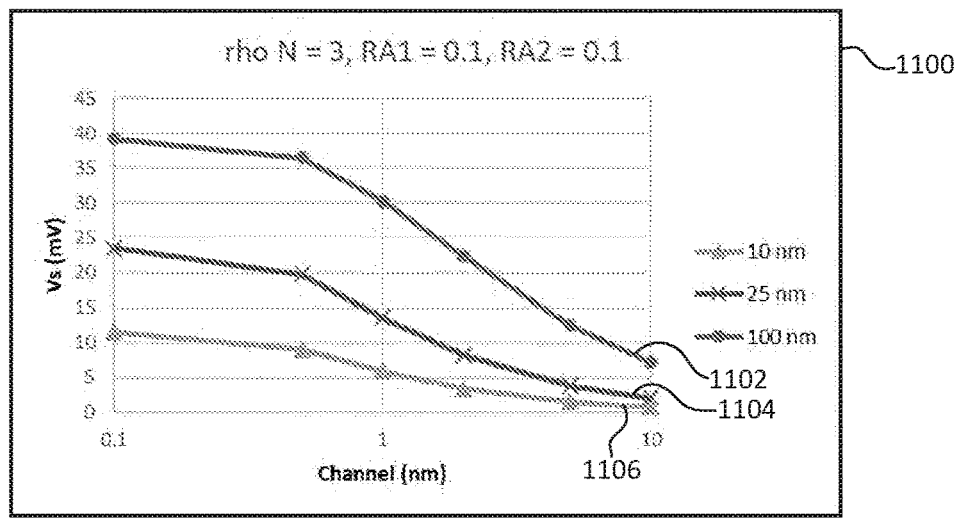
FIGS. 11A-11C are $V_s$ versus channel thickness graphs for different channel resistivity values.
Figure 11B:
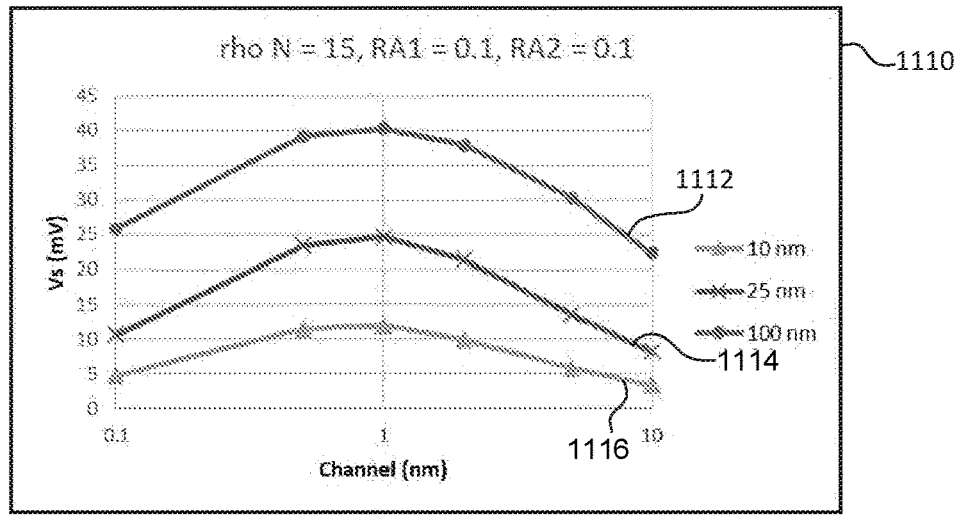
Figure 11C:
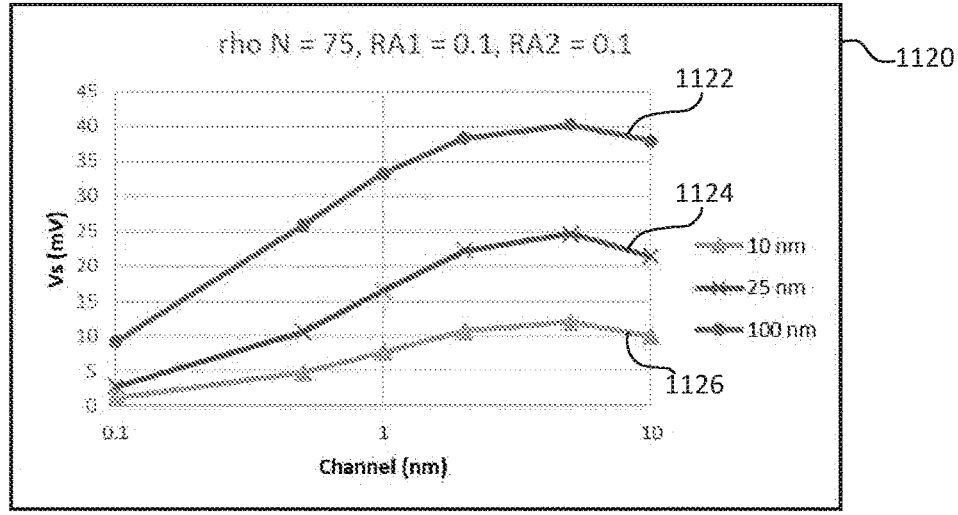

FIGS. 11A-11C are $V_s$ versus channel thickness graphs 1100, 1110 and 1120, respectively, for different channel resistivity values. In FIG. 11A, plot 1102 is for a 10 nm injector width, plot 1104 is for a 25 nm injector width and plot 1106 is for a 100 nm injector width. All plots consider a channel length of 200 nm with a spin diffusion length of 200 nm. The following parameter values were employed to obtain the plots 1102, 1104 and 1106:

Injector $V_{bias}$=100 mV.
Detector width×height=10 nm×10 nm

It should be noted that, in practice, rho N is determined by material, quality and thickness. Values considered below are similar to bulk, thin film literature reports and a high rho case.

For
Rho N=3 μohm·cm (~bulk Cu)
Injector junction RA1=0.1 ohm·μm$_2$ ($J_{limit}$=1e8 A/cm$^2$)
Detector junction RA2=0.1 ohm·μm$^2$ (R~1000 ohm)
$V_s$
Injector area (width 2)=100 nm$^2$, 625 nm$^2$, 10000 nm$^2$
Channel thickness=0.01 to 10 nm.

In FIG. 11B, plot 1112 is for a 10 nm injector width, plot 1114 is for a 25 nm injector width and plot 1116 is for a 100 nm injector width. The following parameter values were employed to obtain the plots 1112, 1114 and 1116:

Injector $V_{bias}$=100 mV.
Detector width×height=10 nm×10 nm
For
Rho N=15 μohm·cm (~thin film Cu)
Injector junction RA1=0.1 ohm·μm$^2$ ($J_{limit}$=1e8 A/cm$^2$)
Detector junction RA2=0.1 ohm·μm$^2$ (R~1000 ohm)
$V_s$
Injector area (width$^2$)=100 nm$^2$, 625 nm$^2$, 10000 nm$^2$
Channel thickness=0.01 to 10 nm.

In FIG. 11C, plot 1122 is for a 10 nm injector width, plot 1124 is for a 25 nm injector width and plot 1126 is for a 100 nm injector width. The following parameter values were employed to obtain the plots 1122, 1124 and 1126:

Injector $V_{bias}$=100 mV.
Detector width×height=10 nm×10 nm
For
Rho N=75 μohm·cm (~high rho for very thin film of Cu)
Injector junction RA=0.1 ohm·μm$^2$ ($J_{limit}$=1e8 A/cm$^2$)
Detector junction RA=0.1 ohm·μm$^2$ (R~1000 ohm)
$V_s$
Injector area (width$^2$)=100 nm$^2$, 625 nm$^2$, 10000 nm$^2$
Channel thickness=0.01 to 10 nm.

In FIGS. 11A-11C, $V_s$ increases by tuning channel resistance (e.g., thickness) with injector and detector resistance. Also, $V_s$ increases with detector junction area.

Figure 12A:
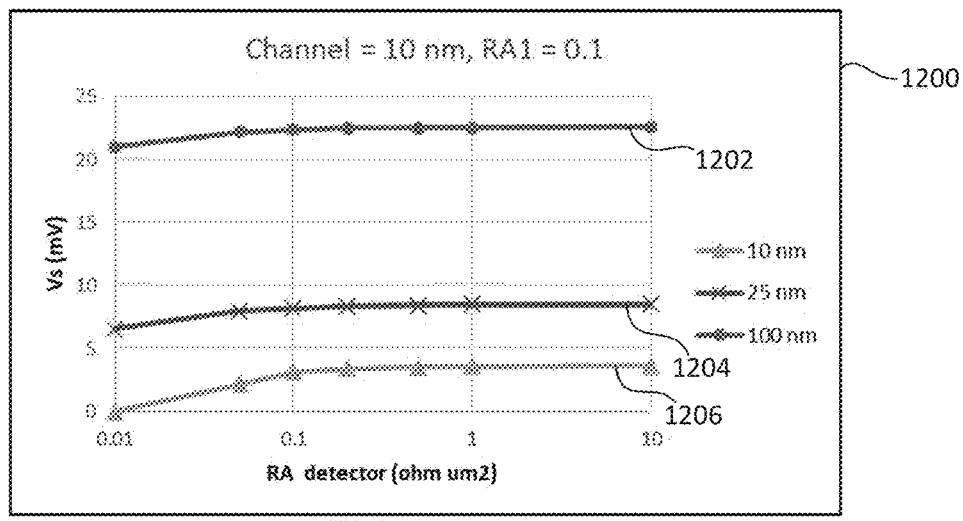
FIGS. 12A-12C are detector $V_s$ versus detector junction RA graphs for different channel thickness values.
Figure 12B:
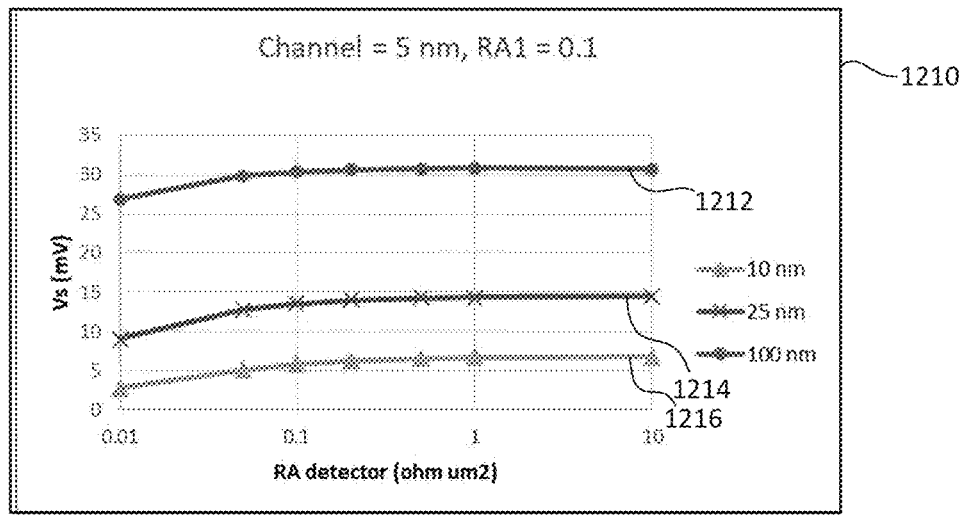
Figure 12C:
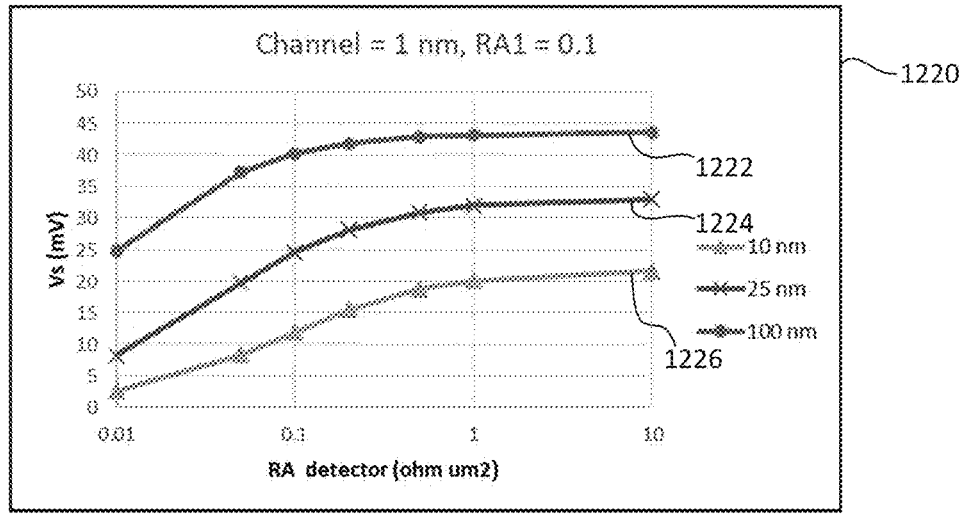

FIGS. 12A-12C are detector $V_s$ versus detector junction RA graphs 1200, 1210 and 1220, respectively, for different channel thickness values. In FIG. 12A, which includes plots for a channel thickness of 10 nm, plot 1202 is for a 10 nm injector width, plot 1204 is for a 25 nm injector width and plot 1206 is for a 100 nm injector width. In FIG. 12B, which includes plots for a channel thickness of 5 nm, plot 1212 is for a 10 nm injector width, plot 1214 is for a 25 nm injector width and plot 1216 is for a 100 nm injector width. In FIG. 12C, which includes plots for a channel thickness of 1 nm, plot 1222 is for a 10 nm injector width, plot 1224 is for a 25 nm injector width and plot 1226 is for a 100 nm injector width. All plots consider a channel length of 200 nm with a spin diffusion length of 200 nm. The following parameter values were employed to obtain the plots 1202-1226:

Injector $V_{bias}$=100 mV.
Detector width×height=10 nm×10 nm
For
Rho N=15 μohm·cm
Injector RA1=0.1 ohm·μm$^2$ ($J_{limit}$=1e8 A/cm$^2$)
$V_s$
Injector area (width)=100 nm$^2$, 625 nm$^2$, 10000 nm$^2$
Detector junction RA2=0.01 to 10. ohm·μm$^2$ In FIGS. 12A-12C, $V_s$ is tuned by increasing detector RA and injector area. The preferred design can be chosen to satisfy the selected detector resistance (e.g., detector resistance=detector RA/detector area).

Figure 13:
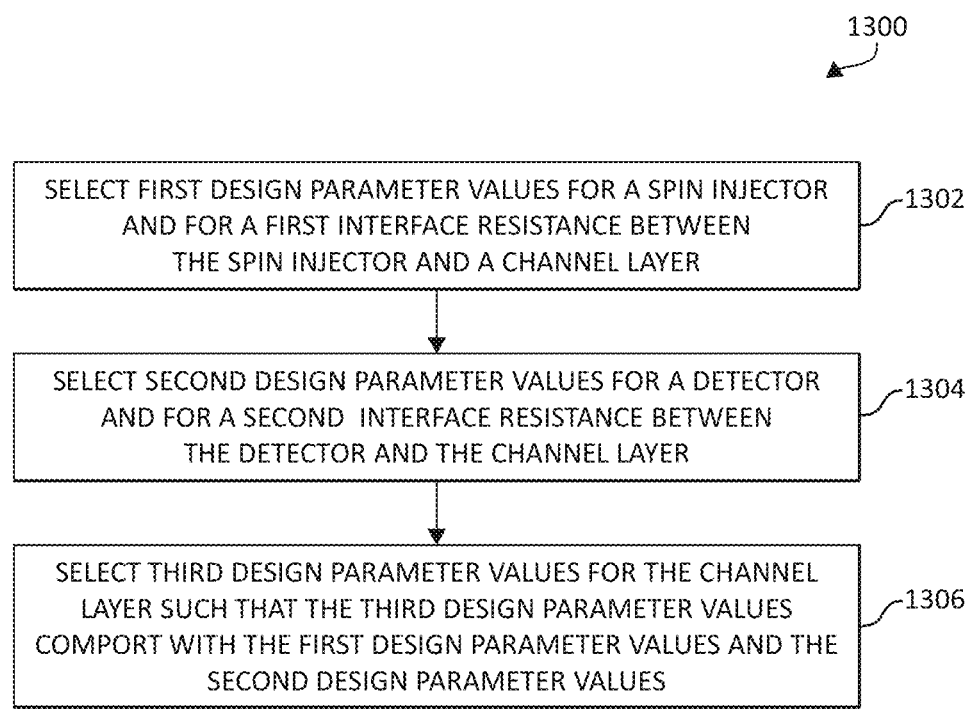
FIG. 13 is a flow diagram of a method embodiment.

FIG. 13 is a flow diagram of a method 1300 in accordance with one embodiment. The method includes, at 1302, selecting first design parameter values for a spin injector and for a first interface resistance between the spin injector and a channel layer. The method also includes, at 1304, selecting second design parameter values for a detector and for a second interface resistance between the detector and the channel layer. The method further includes, at 1306, selecting third design parameter values for the channel layer such that the third design parameter values comport with the first design parameter values and the second design parameter values. In one embodiment, the selection of the third design parameter values includes measuring different detector-channel voltage values for different thickness values for the channel layer between a predetermined low thickness value (e.g., 0.01 nm) and a predetermined high thickness value (e.g., 10 nm). In this embodiment, the method also includes selecting a thickness value of the different thickness values that provides a highest detector-channel voltage value of the measured different detector-channel voltage values.

It should be noted that most of the above-described embodiments are shown with barrier layers between the injector and the channel and the detector and the channel. However, in some embodiments, the injector-channel interface/junction itself and/or the detector/channel interface/junction itself may have resistance values that are suitable for the NLSV sensor, and therefore such embodiments may not employ barrier layers.

Although various uses of the NLSV sensors are disclosed in the present disclosure, embodiments are not limited to the particular applications or uses disclosed in the disclosure. It is to be understood that even though numerous characteristics and advantages of various embodiments of the disclosure have been set forth in the foregoing description, together with details of the structure and function of various embodiments of the disclosure, this disclosure is illustrative only, and changes may be made in detail, especially in matters of structure and arrangement of parts within the principles of the present disclosure to the full extent indicated by the broad general meaning of the terms in which the appended claims are expressed. For example, the particular elements may vary depending on the particular application for the NLSV sensor while maintaining substantially the same functionality without departing from the scope and spirit of the present disclosure. In addition, although the preferred embodiment described herein is directed to particular type of NLSV sensor utilized in a particular data storage system, it will be appreciated by those skilled in the art that the teachings of the present disclosure can be applied to other data storage devices without departing from the scope and spirit of the present disclosure.

What is claimed is:
1. A method comprising:
selecting first design parameter values for a spin injector and for a first interface resistance between the spin injector and a channel layer;
selecting second design parameter values for a detector and for a second interface resistance between the detector and the channel layer;
selecting third design parameter values for the channel layer such that the third design parameter values comport with the first design parameter values and the second design parameter values, the selection of the third design parameter values comprising:
measuring different detector-channel voltage values for different thickness values for the channel layer between a predetermined low thickness value and a predetermined high thickness value; and
selecting a thickness value of the different thickness values that provides a highest detector-channel voltage value of the measured different detector-channel voltage values.

2. The method of claim 1 wherein selecting the first design parameter values comprises selecting a first resistance-area product value for the first interface resistance.

3. The method of claim 1 wherein selecting the second design parameter values comprises selecting a second resistance-area product value for the second interface resistance.

4. The method of claim 1 and wherein the third design parameter values comprise a channel layer resistivity value for a selected channel layer material.

5. The method of claim 1 and further comprising forming a recording head by: forming the detector proximate to a bearing surface;
forming the channel layer behind the detector relative to the bearing surface, and in a substantially same plane as the detector, the channel layer having a front end that is proximate to the detector and a rear end that is away from the detector;
forming the spin injector away from the bearing surface and proximate to a rear end of the channel layer;
forming a first interface layer having the first interface resistance between the spin injector and the channel layer; and
forming a second interface layer having the second interface resistance between the detector and the channel layer,
wherein:
the forming of the spin injector and the first interface layer are carried out according to the first design parameter values; and
the forming of the detector and the second interface layer are carried out according to the second design parameter values; and
the channel layer is formed with a thickness that is substantially equal to the selected thickness value.

6. The method of claim 5 and wherein forming the spin injector comprises forming a large-area spin injector having a width in a direction parallel to the bearing surface that is substantially greater than a width of the detector in a direction parallel to the bearing surface.

7. The method of claim 5 and further comprising forming the first and second interface layers such that the first interface layer has a first resistance-area product value that is substantially greater than a second resistance-area product value of the second interface layer.

8. The method of claim 5 and further forming a top shield above the detector such that the top shield is electrically coupled to the detector.

9. The method of claim 5 and further comprising forming a bottom shield below the detector, electrically insulating the bottom shield from the detector and electrically coupling the bottom shield to the channel layer.

* * * * *